(12) United States Patent
Huang et al.

(10) Patent No.: US 8,755,232 B2
(45) Date of Patent: Jun. 17, 2014

(54) HOT CARRIER PROGRAMMING IN NAND FLASH

(71) Applicant: Macronix International Co., Ltd., Hsinchu (TW)

(72) Inventors: Jyun-Siang Huang, Chiayi (TW); Wen-Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/962,261

(22) Filed: Aug. 8, 2013

(65) Prior Publication Data
US 2013/0322179 A1    Dec. 5, 2013

Related U.S. Application Data

(62) Division of application No. 12/797,994, filed on Jun. 10, 2010, now Pat. No. 8,531,886.

(51) Int. Cl.
*G11C 11/34*    (2006.01)

(52) U.S. Cl.
USPC ................................ 365/185.18; 365/185.17

(58) Field of Classification Search
USPC .................................................... 365/185.18
See application file for complete search history.

(56) References Cited

U.S. PATENT DOCUMENTS

| 7,492,636 | B2 | 2/2009 | Wu |
| 8,531,886 | B2 | 9/2013 | Huang et al. |
| 2007/0217264 | A1 | 9/2007 | Samachisa |
| 2008/0089131 | A1 | 4/2008 | Lee |
| 2009/0027967 | A1 | 1/2009 | Lee |
| 2009/0046506 | A1 | 2/2009 | Lue et al. |
| 2009/0067248 | A1 | 3/2009 | Lee |
| 2009/0086542 | A1 * | 4/2009 | Lee et al. ................. 365/185.17 |
| 2009/0109762 | A1 | 4/2009 | Huang et al. |
| 2009/0257280 | A1 * | 10/2009 | Oh et al. .................. 365/185.19 |

FOREIGN PATENT DOCUMENTS

EP    2048709 A2    4/2009

OTHER PUBLICATIONS

Suh et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

* cited by examiner

*Primary Examiner* — Anthan Tran
(74) *Attorney, Agent, or Firm* — Haynes Beffel & Wolfeld LLP

(57) ABSTRACT

A memory device includes a plurality of memory cells arranged in series in the semiconductor body, such as a NAND string, having a plurality of word lines. A selected memory cell is programmed by hot carrier injection using a boosted channel potential to establish the heating field. Boosted channel hot carrier injection can be based on blocking flow of carriers between a first side of a selected cell and a second side of the selected cell in the NAND string, boosting by capacitive coupling the first semiconductor body region to a boosted voltage level, biasing the second semiconductor body region to a reference voltage level, applying a program potential greater than a hot carrier injection barrier level to the selected cell and enabling flow of carriers from the second semiconductor body region to the selected cell to cause generation of hot carriers.

14 Claims, 17 Drawing Sheets

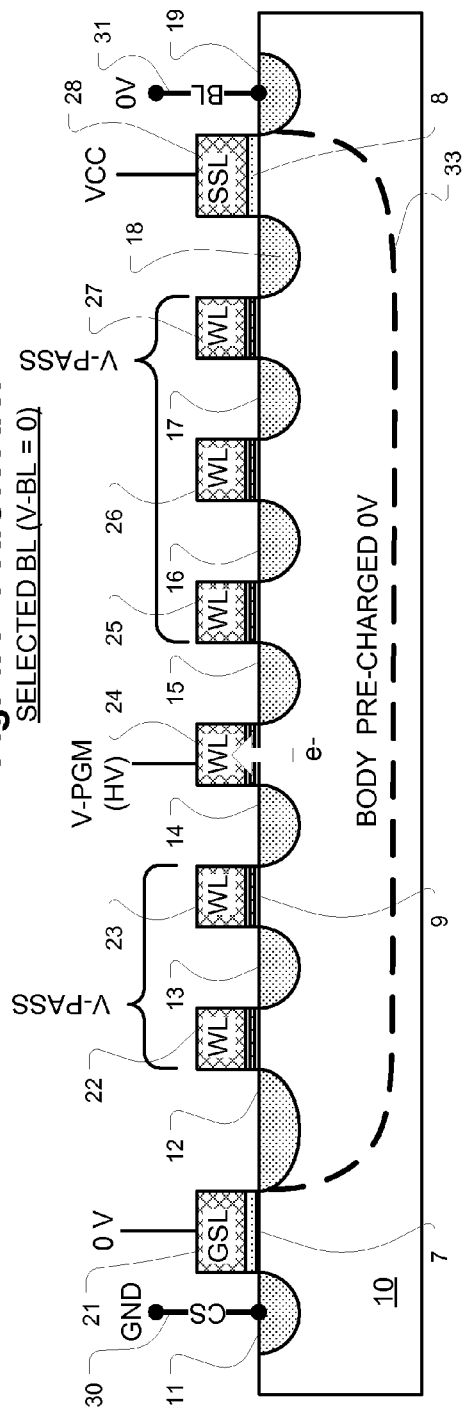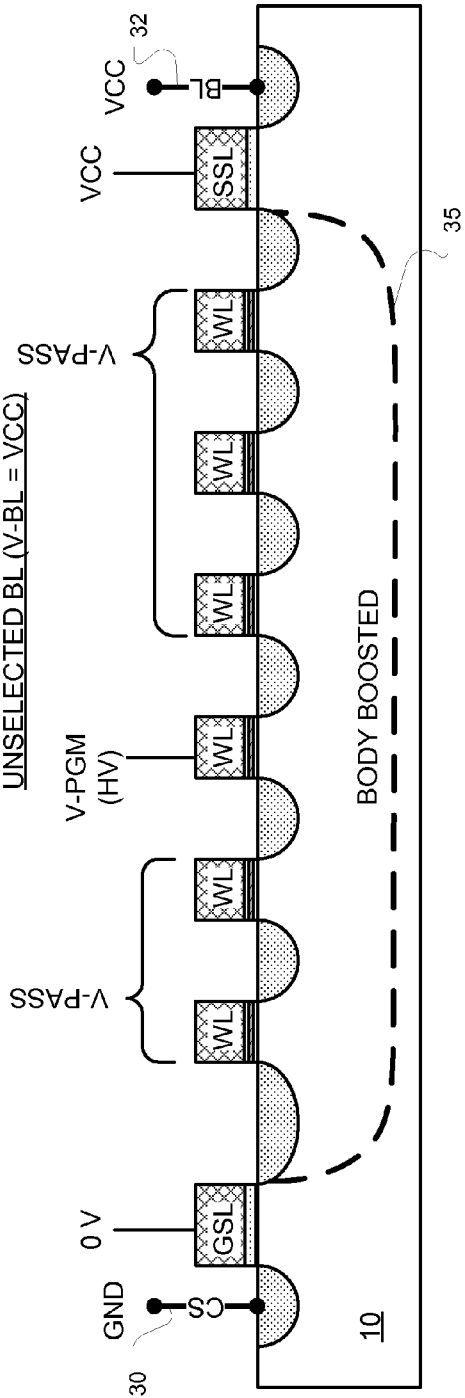

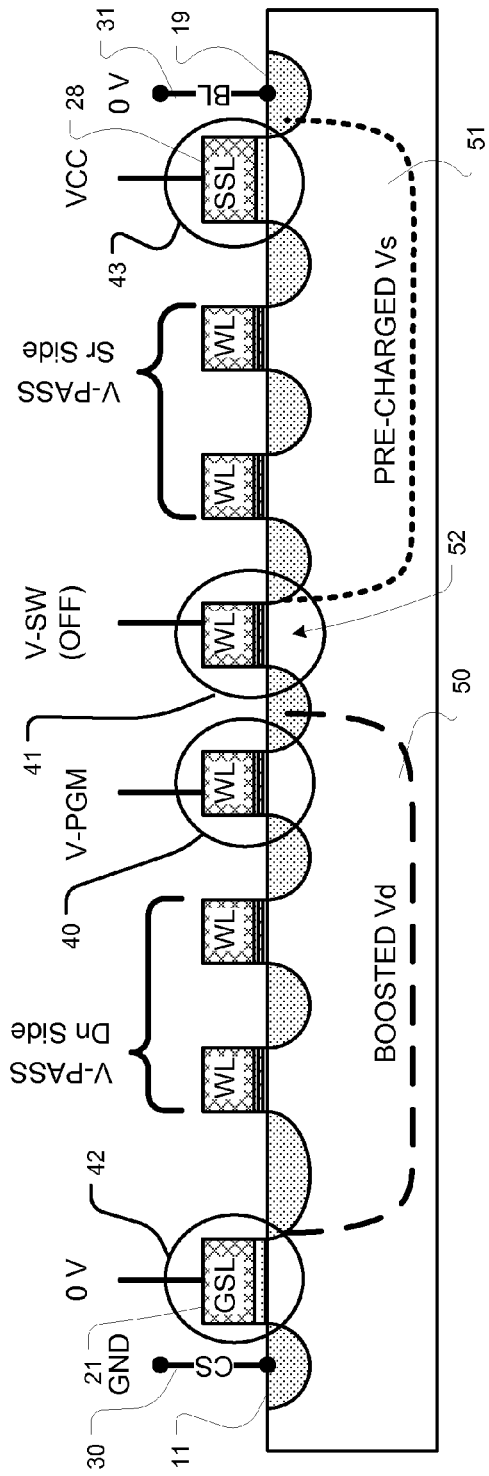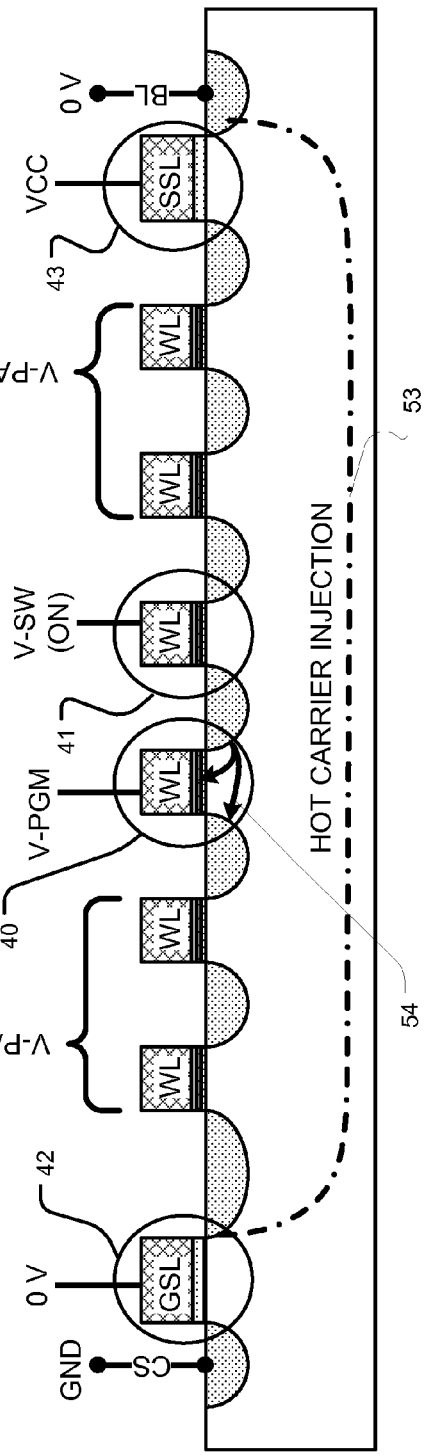

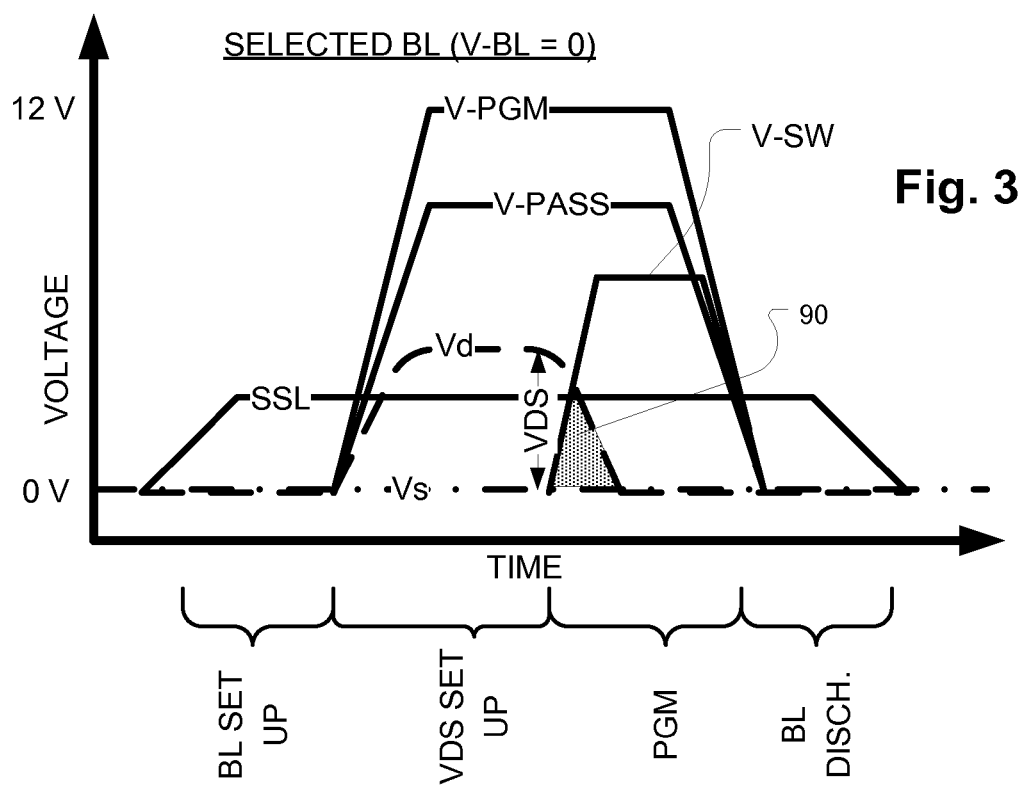
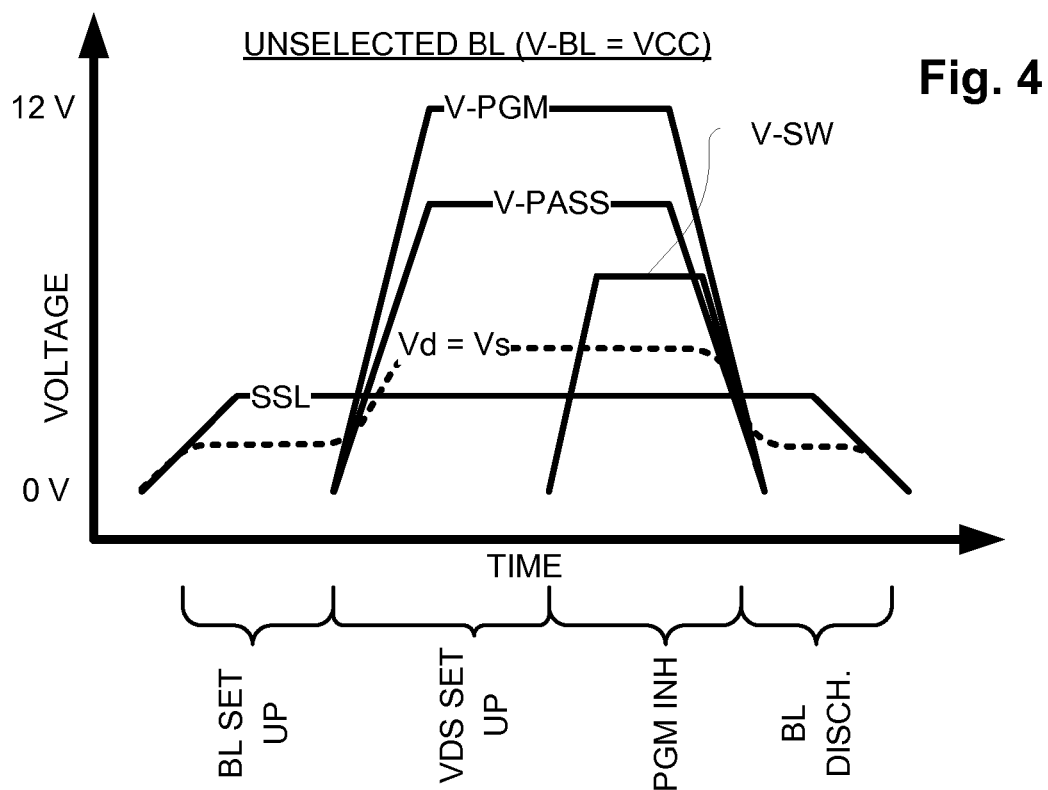

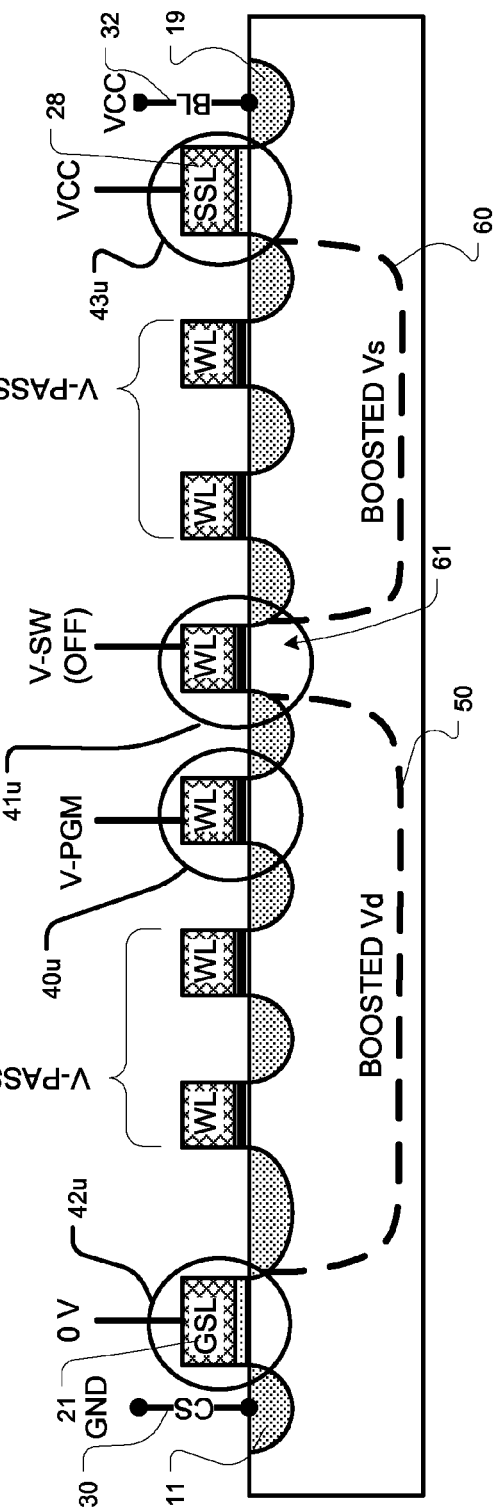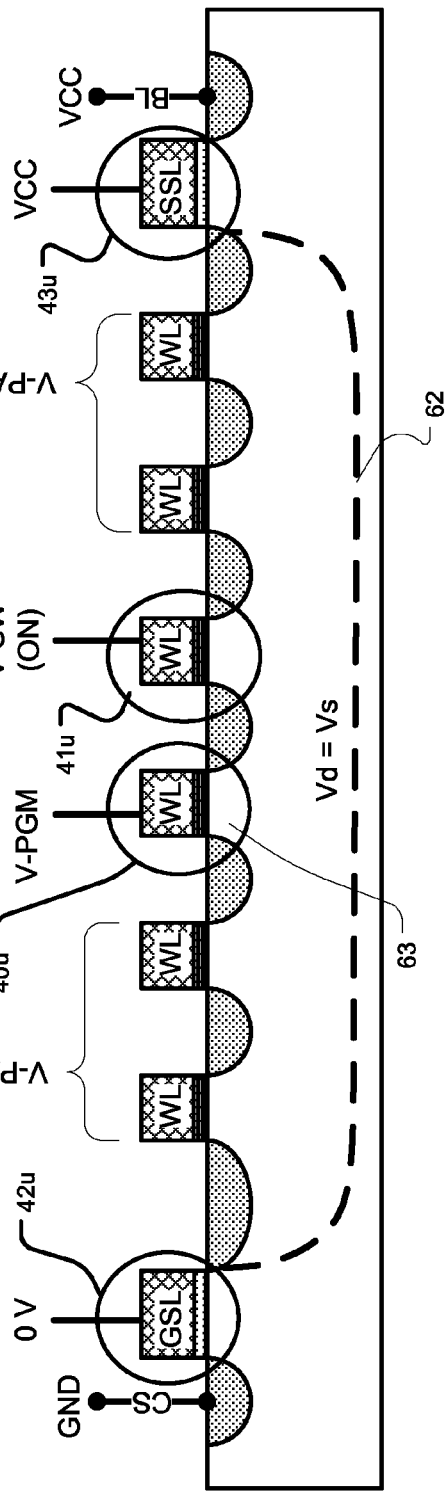

HOT CARRIER PROGRAMMING IN NAND FLASH

RELATED APPLICATIONS

This application is a divisional of U.S. patent application Ser. No. 12/797,994 entitled "HOT CARRIER PROGRAMMING IN NAND FLASH" filed 10 Jun. 2010, (now U.S. Pat. No. 8,531,886); which application is incorporated herein by reference.

BACKGROUND OF THE INVENTION

1. Field of the Invention

The present invention relates to flash memory technology, and more particularly to flash memory suitable for low voltage program and erase in a NAND configuration.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the programming processes typically rely on Fowler-Nordheim (FN) tunneling, and require high voltages, such as on the order of 20 volts, and require high voltage transistors to handle them. The addition of high voltage transistors on integrated circuits, in combination with transistors used for logic and other data flow, introduces complexity in the manufacturing processes. This increased complexity in turn increases the costs of the devices.

Accordingly, it is desirable to provide a new memory technology suitable for low voltage programming operations, and which is configurable in a NAND architecture.

SUMMARY OF THE INVENTION

A memory device is described that includes a plurality of memory cells arranged in series in the semiconductor body, such as can be applied for a NAND string in a NAND array, having a plurality of word lines coupled to corresponding memory cells. Control circuitry is coupled to the plurality of word lines and to the semiconductor body adapted for programming a selected memory cell by hot carrier injection using a boosted channel potential to establish the heating field across the channel of the selected memory cell. Hot carrier injection using this process can be implemented by control circuitry which applies a pass voltage to word lines on a first side of the selected word line during a program interval to boost a first semiconductor body region by capacitive coupling to a boosted voltage level, which applies a program voltage to the selected word line during the program interval, and which applies a biasing condition to a second semiconductor body region on a second side of the selected word line during the program interval to establish a reference voltage level. A switching voltage is applied to a word line, or switching voltages are applied to more than one word lines, adjacent the selected word line. The switching voltage has a first stage during which the first and second semiconductor body regions are isolated by turning off the corresponding cell, while the boosted voltage level and reference voltage level are established in the first and second semiconductor body region. The switching voltage has a second stage in which the corresponding cell is turned on, to couple the reference voltage level to the selected memory cell and cause hot carrier injection.

The selected word line is biased during the program interval by a program voltage which is sufficient to overcome the channel hot carrier injection barrier level. However, this program voltage can be significantly lower than is required for typical Fowler Nordheim programming. The other word lines corresponding with the plurality of memory cells receive a pass voltage which is lower than the program voltage in order to inhibit disturbance of the other cells. The switching voltage during the second stage of the program interval is likewise lower than the program voltage to inhibit disturbance of the switching cell.

For a NAND string embodiment, a first switch (ground select switch or bottom bit line select switch) is provided on a first end of the plurality of transistors, and a second switch (string select switch or top bit line select switch) is provided on a second end of the plurality of transistors. In this embodiment, the control circuitry operates to turn off the first switch during the program interval to enable boosting by isolating the semiconductor body on the first side of the selected word line. The control circuitry operates to turn on the second switch during the program interval to connect the semiconductor body on a second side of the selected word line to a corresponding bit line or reference line from which a reference voltage can be applied.

In a second plurality of memory cells coupled to the same plurality of word lines, such as a parallel NAND string on an unselected bit line, the control circuitry can operate using a "boosted source" arrangement, by turning off the first switch for the second plurality of cells and turning off the second switch while applying pass voltages to memory cells on both the first and second side of the selected cell. In this arrangement, the semiconductor body regions on both sides of the selected word line are boosted to similar voltage levels to prevent hot carrier injection in unselected strings. Alternatively, the control circuitry can operate using a "grounded drain" arrangement, by turning on the first switch and turning on the second switch to bias a semiconductor region on both sides of the selected word line to a reference voltage level to prevent hot carrier injection in unselected strings.

The control circuitry can operate to maximize the capacitance of the first semiconductor body region which is boosted to a boosted voltage level by applying a number of techniques. According to one technique, the plurality of memory cells can be extended to include one or more extra memory cells along with one or more dummy word lines, and disposed between the plurality of memory cells and the first switch. In this technique, the control circuitry applies a pass voltage to the additional dummy word line or word lines to expand the size, and thereby the capacitance, of the first semiconductor body region. According to another technique, the control circuitry can organize the plurality of word lines into a first set of word lines near one end of the plurality of memory cells, and a second set of word lines near another end of the plurality of memory cells. To program a selected memory cell, the control circuitry determines the one of the first and second sets of which the selected word line is a member, and assigns the first side of the selected word line, which is to be boosted to the boosted voltage level, as that side including the other of the first and second sets. In this way, at least all of the word lines in one of the first and second sets are used to establish the size of the first semiconductor body region. In this manner, the first semiconductor body region used to establish the boosted voltage level can be larger than the second semiconductor body region used to establish the reference voltage level for all of the memory cells in the string.

A method for inducing hot carrier injection for programming a selected cell in a NAND string is described as based on blocking flow of carriers between a first semiconductor body region on a first side of the selected cell in the NAND string and a second semiconductor body region on a second side of the selected cell well boosting the first semiconductor body region by capacitive coupling to a boosted voltage level and then biasing the second semiconductor body region to a reference voltage level. A program potential higher than a hot carrier injection barrier level is applied to the selected cell, and then the flow of carriers is enabled from the second semiconductor body region at the reference voltage level to the selected cell. In this manner, the heating potential for hot carrier injection is provided by the capacitively boosted virtual drain on the first side of the selected cell.

Other aspects and advantages of the present invention can be seen on review of the drawings, the detailed description in the claims which follow.

BRIEF DESCRIPTION OF THE DRAWINGS

FIGS. 1A and 1B are simplified cross-sectional views of a selected NAND string and an unselected NAND string biased according to prior art programming techniques.

FIGS. 2A and 2B are simplified cross-sectional views of a selected NAND string showing first and second stages respectively of a program interval for boosted node hot carrier injection.

FIG. 3 is a timing diagram for a program interval such as that illustrated with respect to FIGS. 2A and 2B for a target memory cell.

FIG. 4 is a timing diagram for a program interval for a memory cell sharing a word line with the target memory cell in a parallel, unselected NAND string.

FIGS. 5A and 5B are simplified cross-sectional views of an unselected NAND string showing first and second stages respectively of a program interval for boosted node hot carrier injection showing how disturbance of unselected cells prevented.

DETAILED DESCRIPTION

Figure 6:
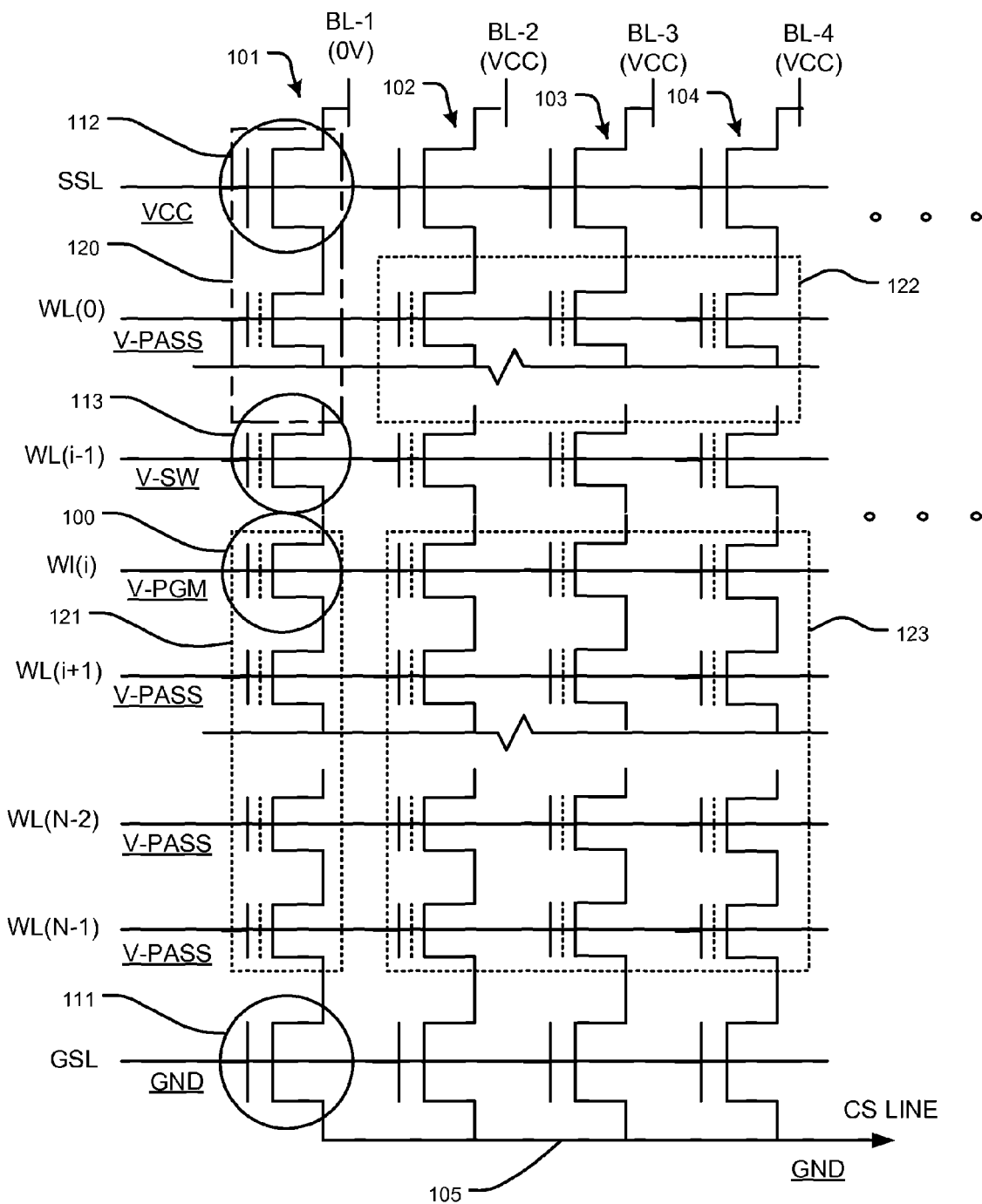
FIG. 6 is a schematic diagram of a common source type NAND-type memory array employing a program bias operation as described herein.

A detailed description of embodiments of the present invention is provided with reference to the FIGS. 1-19.

FIGS. 1A and 1B show in cross-section a plurality of dielectric charge trapping flash memory cells arranged in series to form a NAND string and biased for FN tunneling programming, as is typical in prior art NAND architecture flash memory. FIG. 1A shows the biasing for a NAND string that includes a target cell on a selected bit line, while FIG. 1B shows the biasing for a NAND string on an unselected bit line. One technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Nonvolatile memory device, method of operating same and method of fabricating the same."

Referring to FIG. 1A, the memory cells are formed in a semiconductor body 10. For n-channel memory cells, the semiconductor body 10 can be an isolated p-well, within a deeper n-well in a semiconductor chip. Alternatively, the semiconductor body 10 can be isolated by an insulating layer or otherwise. Some embodiments may employ p-channel memory cells in which the doping for the semiconductor body would be n-type.

The plurality of flash memory cells is arranged in a string extending in a bit line direction, orthogonal to word lines. Word lines 22-27 extend across a number of parallel NAND strings. Terminals 12-18 are formed by n-type regions (for n-channel devices) in the semiconductor body 10, and act as the source/drain regions for the memory cells. A first switch formed by a MOS transistor having a gate in a ground select line GSL 21 is connected between the memory cell corresponding with first word line 22 and a contact 11 formed by an n-type region in the semiconductor body 10. The contact 11 is connected to common source CS line 30. A second switch formed by a MOS transistor having a gate in a string select line SSL 28 is connected between the memory cell corresponding to the last word line 27 and a contact 19 formed by an n-type region in the semiconductor body 10. The contact 19 is connected to a bit line BL 31. The first and second switches in the illustrated embodiment are MOS transistors, having gate dielectrics 7 and 8 formed by for example silicon dioxide.

In this illustration, there are six memory cells in the string for simplicity. In typical implementations, a NAND string may comprise 16, 32 or more memory cells arranged in series. The memory cells corresponding to the word lines 22-27 have charge trapping structures 9 between the word lines and channel regions in the semiconductor body 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, may be omitted from the structure.

FIG. 1A shows the biasing according to a typical prior art technology to induce FN tunneling to program the memory cell corresponding with word line 24. According to the biasing illustrated, the GSL is biased to about zero volts while the common source line is grounded, so that the first switch corresponding to the GSL line 21 is off, and the SSL is biased to about VCC while the selected bit line is grounded, so that the second switch corresponding to the SSL line 28 is on. In these conditions, the semiconductor body in the region 33 associated with the NAND string is pre-charged to about 0 Volts. The selected word line 24 is biased at a high-voltage programming level V-PGM, which can be on the order of 20 volts in some embodiments. The unselected word lines 22, 23 and 25-27 are biased to a pass voltage V-PASS, which is less than V-PMG by an amount that inhibits programming in unselected memory cells in the string. As a result, electrons tunnel into the charge trapping structure of the selected memory cell.

FIG. 1B shows the biasing according to prior art technology at unselected bit lines for NAND strings which share the word lines 22-27 with the string shown in FIG. 1A. As can be seen, the GSL, the SSL and all of the word lines have the same bias voltages as shown in FIG. 1A. Likewise, the common source line 30 is grounded. However, the unselected bit line 32 is biased to a level about VCC. This turns off the second switch, which corresponds with the SSL line, and decouples the semiconductor body in the region 35 from the unselected bit line BL 32. As a result, the semiconductor body in the region 35 is boosted by capacitive coupling from the voltages applied to the word lines 22-27, which prevents formation of electric fields sufficient to disturb the charge trapped in the memory cells in the unselected NAND string. So called incremental step pulsed programming ISPP operations based on capacitive self-boosting are common in the art.

FIGS. 2A and 2B show two stages of a two-stage programming bias for a selected NAND string, for boosted-drain, hot carrier programming as described herein. For n-channel embodiments, the hot carriers include electrons. For p-channel embodiments, similar bias techniques can be applied to induce hot hole injection, in which the hot carriers include holes. The program process is described with reference to the n-channel embodiment herein, but is referred to as boosted node hot carrier injection in reference to alternative p-channel embodiments.

In FIG. 2A, a first stage is illustrated, in which the common source CS line 30 is grounded, and the selected bit line 31 is also coupled to about zero volts. The GSL line 21 is coupled to about zero volts turning off the first switch 42, decoupling the semiconductor body from the CS line 30. The SSL line 28 is coupled to about VCC, turning on the second switch 43, and coupling the semiconductor body to the selected bit line 31. The word line corresponding to the target memory cell 40 receives a program pulse at V-PGM. The word line adjacent the target memory cell 40 on the side of the bit line BL 31 receives a two stage switching voltage V-SW which, during this first stage of the program interval, is at a low voltage so that the channel of switching memory cell 41 is off, and serves to isolate the regions 50 and 51 in the semiconductor body. Under the biasing condition during a program interval, the region 50 in the semiconductor body 10 is boosted to a virtual drain voltage Vd by capacitive coupling in response to the pass voltages V-PASS (drain side) on the word lines between the target word line which receives V-PGM and the first switch 42. The region 51 in the semiconductor body 10 is pre-charged to a virtual source voltage Vs by coupling of the bit line 31 biased to 0 Volts to the substrate. The voltage V-PASS (source side) is coupled to the word lines between the switching cell 41 and the second switch 43. V-PASS (source side) may be the same voltage as V-PASS (drain side), or may be different as suits a particular implementation or programming condition. The boosted voltage level in region 50 and the reference voltage level in the region 51 are isolated by the depleted region 52 beneath the switching memory cell during this first stage of the program interval.

In this example, as in all example NAND strings shown herein, the first and second switches (42, 43) are implemented by field effect transistors in series with the memory cells in the string. In the example shown in FIG. 2A, the gate dielectrics for the field effect transistors are drawn as single layer structures, and typically comprise a layer of a silicon oxide or nitrogen doped silicon oxide. In other the implementations, the field effect transistor used for the switches (e.g. 42, 43) in example NAND strings shown herein, can have a multilayer gate dielectric, including a gate dielectric that is implemented in the same manner as the charge storage layers in the memory cells in the string. This approach can simplify the manufacturing process. In such embodiments, the first and second switches can be characterized as being "memory cells." The channel lengths of the field effect transistors used to implement the switches can be longer than the channel length in memory cells if desired.

In FIG. 2B, the second stage of the program interval is illustrated, where the switching voltage V-SW changes to turn on the switching memory cell 41 adjacent the target memory cell 40. The difference between Vd and Vs during the transition is sufficient to induce hot carriers 54 in the channel of the target memory cell. The voltage V-PGM on the word line corresponding to the target memory cell is sufficient to overcome the barrier height for the hot carriers, and as a result hot carrier injection programming is induced. A program operation can include a sequence of program intervals as described with reference to FIGS. 2A and 2B, with intervening program verify steps, to efficiently achieve target threshold values. Embodiments can apply this technology for multilevel programming to store more than one bit per cell.

FIG. 3 is a timing diagram showing the voltage waveform for the two stage program interval shown in FIGS. 2A-2B for a selected bit line. During a bit line set up interval, the SSL line is increased to a level about VCC. During the set up interval, the voltage level Vd of the virtual drain region 50 and the voltage level Vs of the virtual source region 51 remain at about zero volts. During a program interval, the voltage V-PGM is pulsed to a level sufficient to overcome the hot carrier injection barrier level as discussed above. Also, in the first stage of the program interval, which can be referred to as a VDS setup stage, voltage V-PASS is pulsed to a level less than V-PGM by an amount sufficient to inhibit programming of other cells in the string. The voltage V-PASS may be lower on the virtual source side than on the virtual drain side in some implementations. During the first stage of the program interval, the voltage V-SW remains at a low voltage to turn off the cell 41. The virtual drain region 50 is boosted by capacitive coupling so that virtual drain voltage Vd rises above the VCC level in this example, while the virtual source voltage Vs remains at about zero volts. After a sufficient interval to allow the drain to source voltage VDS for the target memory cell to reach a level at which hot carrier injection can be induced, a second stage of the program interval is begun, which can be referred to as the program stage. In the second stage of the program interval, the voltage V-SW is pulsed to a switching voltage, which has a level in this embodiment which is not higher than V-PASS. During at least a first part of the interval represented by shaded region 90, while the drain/source voltage VDS remains sufficient to induce hot carriers, hot carrier injection occurs to program the target memory cell. After V-PASS and V-PGM fall at the end of the program stage of the program interval, the SSL line may remain at VCC for an interval in which the semiconductor body can be discharged through the selected bit line.

FIG. 4 shows the voltage waveform for the program interval for a NAND string on an unselected bit line, which shares word lines with the selected NAND string. In the NAND string on the unselected bit line, the semiconductor body voltage level rises during the bit line set up interval to the first level, and is boosted by the word line voltages during the first and second stages of the program interval so that the virtual drain and virtual source voltages are equal, or close to equal, when the second stage of the program interval begins. As a result, hot carriers are not generated in NAND strings on the unselected bit lines, and the memory cells are not disturbed.

FIGS. 5A and 5B show two stages of a programming bias for an unselected NAND string, in the event that a NAND string sharing word lines is selected for boosted-node hot carrier programming as described herein, under the bias condition shown in FIG. 4. In FIG. 5A, a first stage is illustrated, in which the common source CS line 30 is grounded, and the unselected bit line 32 is coupled to about VCC, rather than to 0 V as is applied to the selected bit line. The GSL line 21 is coupled to about zero volts turning off the first switch 42u, decoupling the semiconductor body from the CS line 30. The SSL line 28 is coupled to about VCC, which does not turn on the second switch 43u, thereby decoupling the semiconductor body from the unselected bit line 32. The word line corresponding to the unselected target memory cell 40u receives a program pulse at V-PGM. The word line adjacent the unselected target memory cell 40u on the side of the bit line receives a switching voltage V-SW, which during this first stage of the program interval is at a low voltage so that the switching memory cell 41u serves to isolate the regions 50 and 60 in the semiconductor body. Under the biasing condition during the first stage of the program interval, the region 50 in the semiconductor body 10 is boosted to a virtual drain voltage Vd by capacitive coupling in response to the pass voltages V-PASS (drain side) on the word lines between the target word line which receives V-PGM and the first switch 42u. The region 60 in the semiconductor body 10 on the unselected bit line is also boosted and achieves a level Vs that is close to Vd, by capacitive coupling in response to the pass voltages V-PASS (source side). The boosted voltage level in region 50 and the reference voltage level in the region 60 are close to one another, but remain isolated by the depleted region 61 beneath the switching memory cell 41u.

In FIG. 5B, the second stage of the program interval is illustrated, where the switching voltage V-SW changes to turn on the switching memory cell 41u, coupling the regions 50 and 60 together to form boosted region 62. The difference between Vd and Vs during the transition is zero, or is a level that is too low to induce hot carriers in the channel of the memory cell corresponding to the target word line. The voltage V-PGM on the word line corresponding to the unselected target memory cell 40u is insufficient to induce FN tunneling in the region 63, and so the unselected memory cell 40 on the unselected bit line is not disturbed.

Representative bias levels for program and erase operations are shown in the following table.

|  | Program | Erase |
| --- | --- | --- |
| Unselected WL | 6 V~12 V | −8 V |
| Selected WL | 10 V~16 V | −8 V |
| Switch WL (in second stage) | 4 V~12 V | −8 V |
| Unselected BL | VCC | Floating |
| Selected BL | 0 V | Floating |
| PW | 0 V | 12 V |
| SSL | VCC | Floating/VCC |
| GSL | 0 V | Floating/VCC |
| Common Source | 0 V | Floating |

FIG. 6 is a circuit diagram showing layout of four NAND strings 101, 102, 103, 104 coupled to respective bit lines BL-1 to BL-4 and to a common source CS line 105 by string select transistors (e.g. 112) and ground select transistors (e.g. 111), respectively. For the purpose of illustration, the bias voltages are shown for programming a target memory cell 100 on corresponding word line WL(i) in the NAND string 101. The first switch transistor 111 is biased by ground on the GSL line to decouple the NAND string from the CS line 105. The second switch transistor 112 is biased by the SSL line to couple the NAND string to the selected bit line BL-1. A switching memory cell 113 on a corresponding word line WL(i−1) is adjacent the target memory cell 100. Thus, the word line WL(i−1) receives V-SW supporting the two-stage program interval. During the first stage of the program interval, the semiconductor body in region 120 is biased to the virtual source voltage Vs about zero volts, and the semiconductor body in the region 121 is biased by capacitive coupling to the virtual drain voltage Vd. On the unselected bit lines, the regions 122, 123 are biased by capacitive coupling also to a relatively high voltage. Thus, when the second stage of the program interval starts, hot carrier injection happens in the target memory cell 100, while the other memory cells in the array are not disturbed. Note that when a target memory cell is on the first word line WL(0), the string select line SSL can be used to apply the switching voltage V-SW to the switch transistor 112, allowing the bit line terminal for the NAND string to operate as the virtual source.

Figure 7:
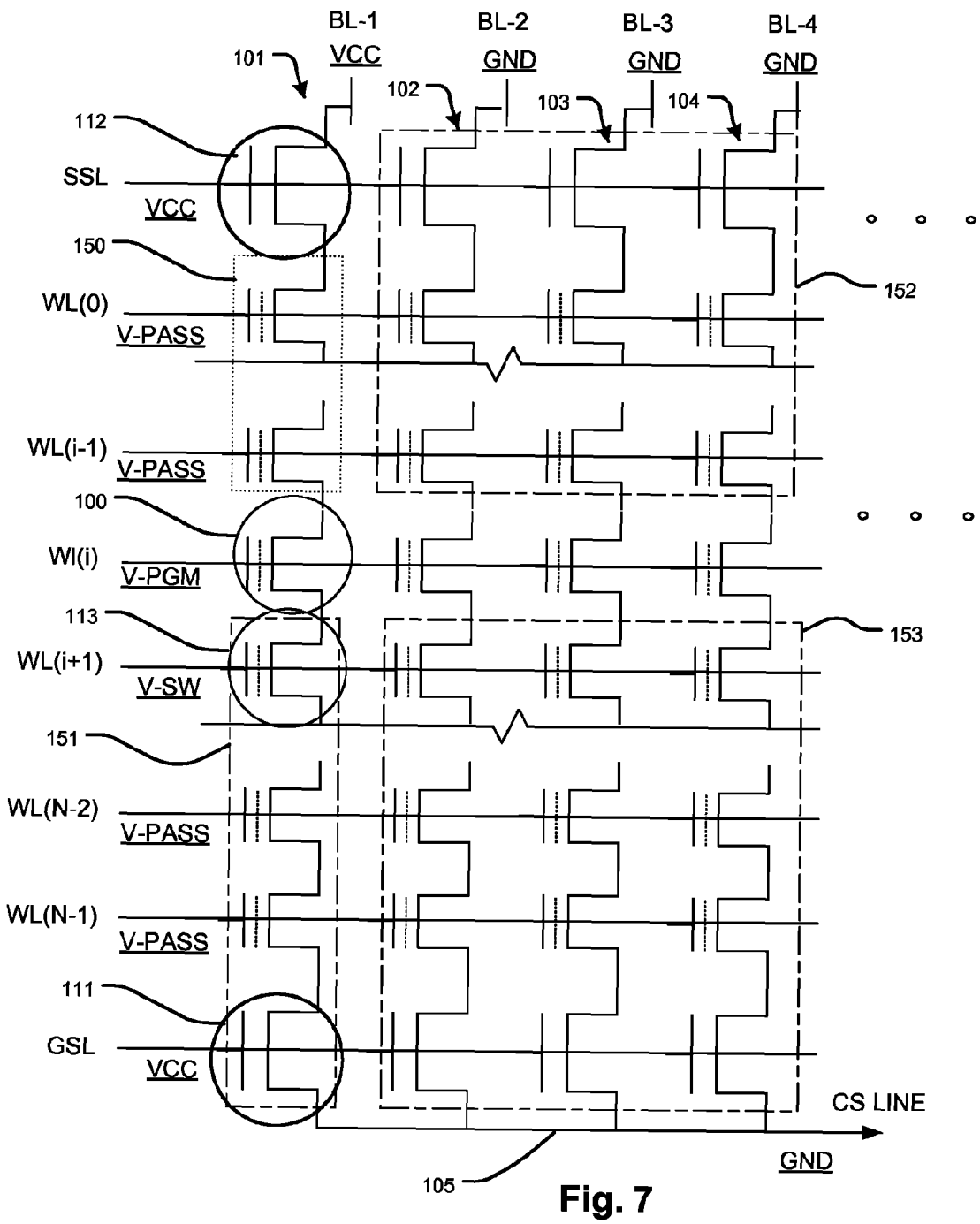
FIG. 7 is a schematic diagram of a common source type NAND-type memory array employing a program bias operation as described herein according to an alternative configuration.

FIG. 7 shows the bias conditions in which the switching memory cell 113 is adjacent to target memory cell 100 on the common source CS side of the string. Thus, FIG. 7 is a circuit diagram showing layout of four NAND strings 101, 102, 103, 104 which are coupled to respective bit lines BL-1 to BL-4 and to a common source CS line 105 by string select transistors and ground select transistors, respectively. The bias voltages are shown for programming a target memory cell 100 on a corresponding word line WL(i) in the NAND string 101. The first switch transistor 111 is biased by VCC on the GSL line to couple the NAND string to the grounded CS line 105. The second switch transistor 112 is biased by VCC on the SSL line and VCC on the selected bit line BL-1 to decouple the NAND string from the selected bit line BL-1. A switching memory cell 113 on corresponding word line WL(i+1) is adjacent the target memory cell 100. Thus, the word line WL(i+1) receives V-SW supporting the two stage program interval. During the first stage of the program interval, the semiconductor body in region 150 is biased to the virtual drain voltage Vd by capacitive coupling. The semiconductor body in the region 151 is biased to the virtual source voltage Vs via the CS line. On the unselected bit lines, which are coupled to 0 V, the region 152 is biased to ground via unselected bit lines BL-2 to BL-4 and the region 153 is biased to ground via the CS line 105. Thus, when the second stage of the program interval starts, hot carrier injection happens in the target memory cell 100, while the other memory cells in the array are not disturbed.

FIGS. 6 and 7 show the possibility of using biasing in two directions, from the top and from the bottom of the string, within a single array configuration. This can be beneficial in order to ensure that the part of the semiconductor body acting as a virtual drain has sufficient capacitance for maintaining hot carrier injection current needed for reasonable programming speed. For example, the programming controller can be implemented to bias the array so that the virtual drain side of the target memory cell has at least one half of the total number of word lines within the NAND string.

Figure 8:
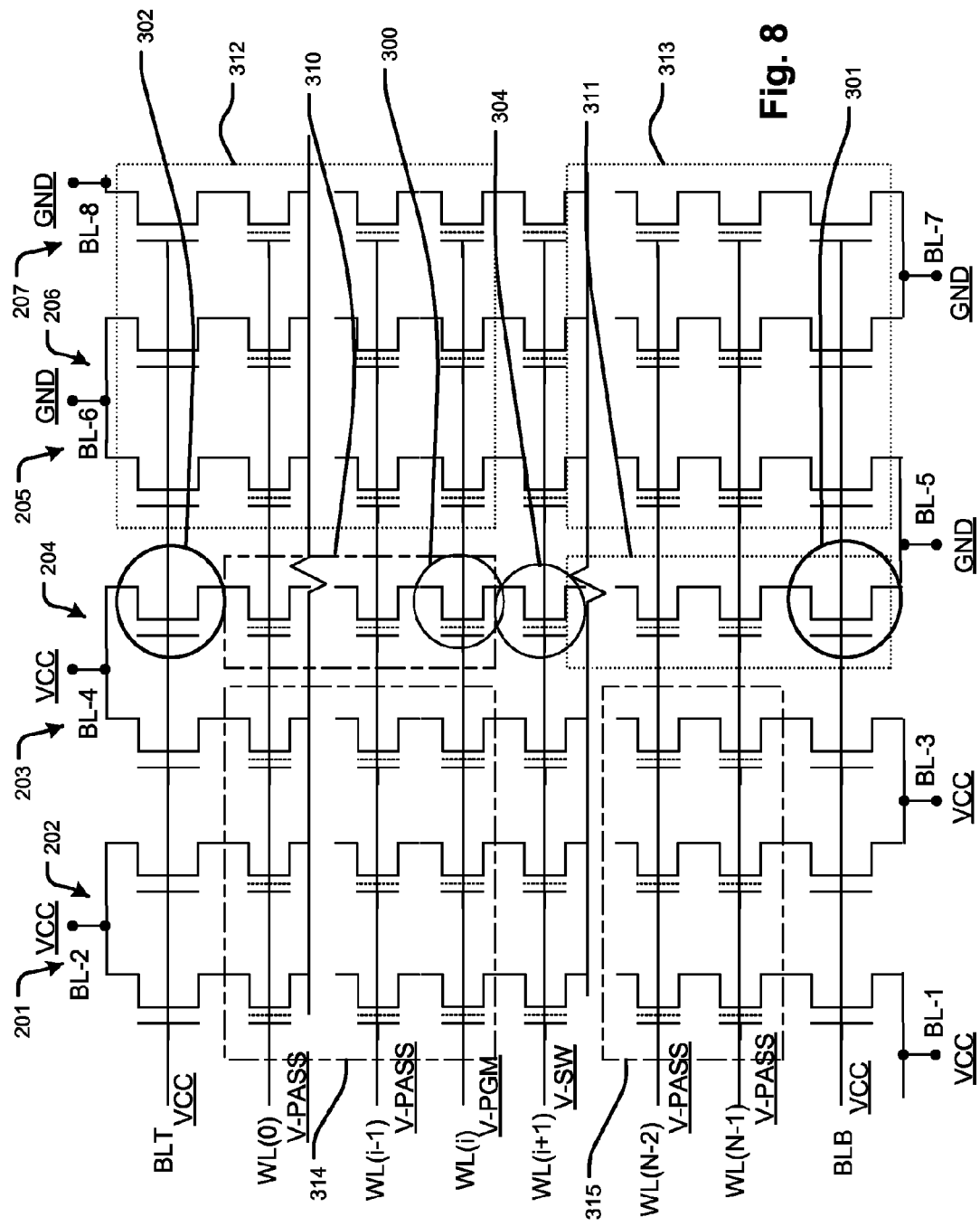
FIG. 8 is a schematic diagram of a virtual ground NAND-type memory array employing a program bias operation as described herein.

FIG. 8 is a circuit diagram showing layout of seven NAND strings 201-207 arranged in a virtual ground NAND architecture. In a virtual ground architecture as described here, the bit lines act as both bit lines coupled to sense amplifiers and reference lines coupled to reference voltage sources, depending on the column being accessed. The NAND strings are coupled to corresponding pairs of bit lines BL-1 to BL-8 by top bit line select transistors BLT and bottom bit line select transistors BLB. For the purpose of illustration, the bias voltages are shown for programming a target memory cell 300 on corresponding word line WL(i) in the NAND string 204. The first switch transistor 301 is biased by VCC on the BLB line to couple the NAND string 204 to BL-5, which is grounded. The second switch transistor 302 is biased by VCC on the BLT line to decouple the NAND string 204 from the bit line BL-4, which is biased at VCC. All of the bit lines BL-1 to BL-3 to the left of target NAND string 204, are biased at VCC. All of the bit lines BL-6 to BL-8 to the right of the target NAND string 204 are biased at ground. A switching memory cell 304 on corresponding word line WL(i+1) is adjacent the target memory cell 300. Thus, the word line WL(i+1) receives the V-SW supporting the two stage program interval. During the first stage of the program interval, the semiconductor body in region 311 is biased to the virtual source voltage Vs about zero volts. The semiconductor body in the region 310 is biased by capacitive coupling to the virtual drain voltage Vd, thereby setting up for the second stage of the program interval in which hot carrier injection causes programming of the target cell 300. On the unselected strings to the right, the regions 312 and 313 are biased to ground potential via the bit lines BL-5 to BL-8 to avoid disturbance of memory cells in those strings. On the unselected strings to the left, the regions 314 and 315 are boosted by capacitive coupling to a relatively high voltage to avoid disturbance of memory cells in those strings. Thus, when the second stage of the program interval starts, hot carrier injection happens in the target memory cell 300, while the other memory cells in the array are not disturbed.

Figure 9:
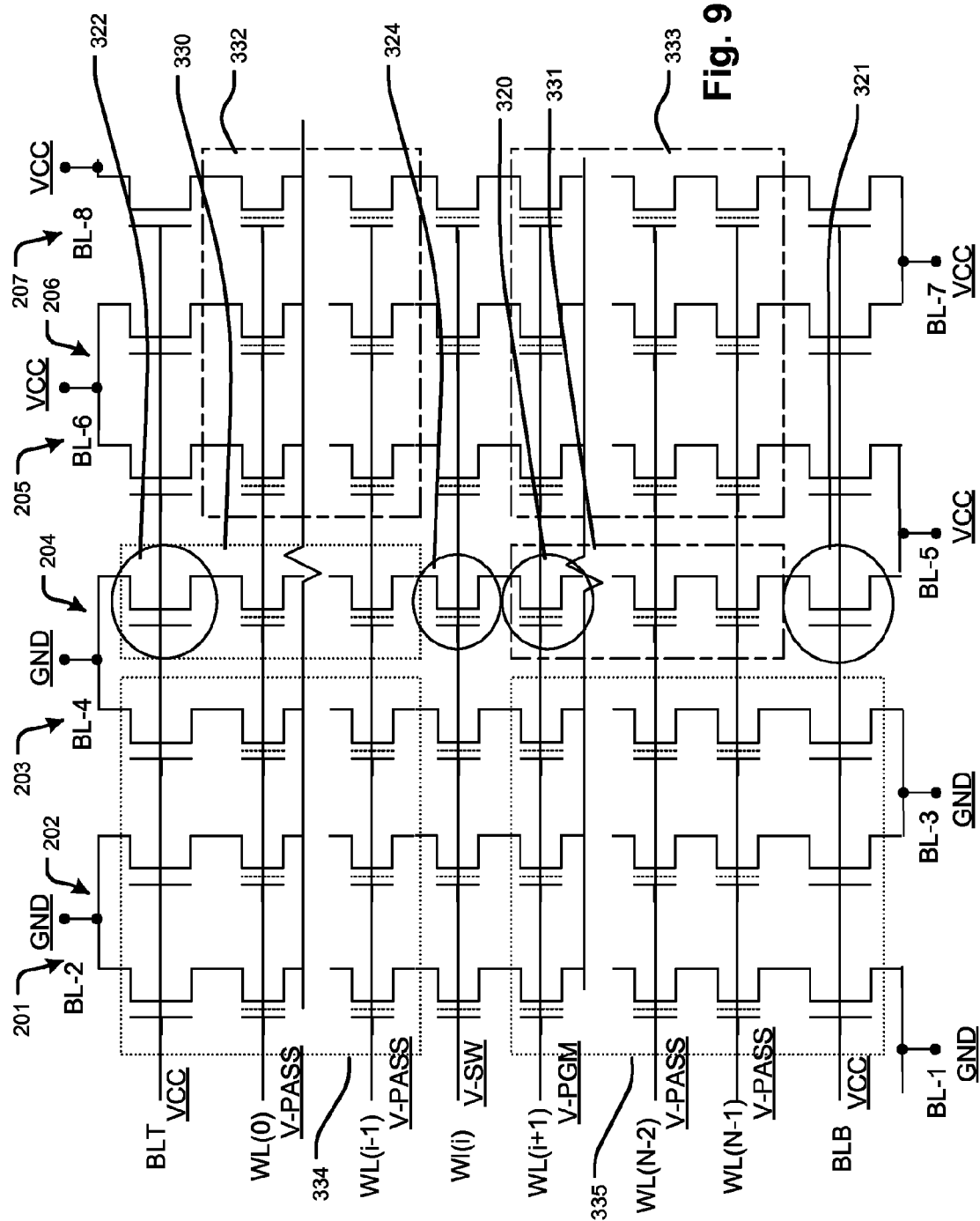
FIG. 9 is a schematic diagram of a virtual ground NAND-type memory array employing a program bias operation as described herein according to an alternative configuration.

FIG. 9 shows a biasing arrangement for a virtual ground NAND array like that shown in FIG. 8, in which the switching transistor is on the other side. The NAND strings are coupled to corresponding pairs of bit lines BL-1 to BL-8 by top bit line select transistors BLT and bottom bit line select transistors BLB. For the purpose of illustration, the bias voltages are shown for programming a target memory cell 320 on corresponding word line WL(i+1) in the NAND string 204. The first switch transistor 321 is biased by VCC on the BLB line, which decouples the NAND string 204 from BL-5, which is biased at VCC. The second switch transistor 322 is biased by VCC on the BLT line to couple the NAND string to the bit line BL-4 which is grounded. All of the bit lines BL-1 to BL-3 to the left of NAND string 204 are grounded. All of the bit lines BL-6 to BL-8 to the right of NAND string 204 are biased at VCC. A switching memory cell 324 on corresponding word line WL(i) is adjacent the target memory cell 320. Thus, the word line WL(i) receives V-SW supporting the two-stage program interval. During the first stage of the program interval, the semiconductor body in region 330 is biased to the virtual source voltage Vs about zero volts. The semiconductor body in the region 331 is biased by capacitive coupling to the virtual drain voltage Vd, thereby setting up for the second stage of the program interval in which hot carrier injection causes programming of the target cell 320. On the unselected strings to the right, the regions 332 and 333 are boosted by capacitive coupling also to a relatively high voltage to avoid disturbance of memory cells in those strings. On the unselected strings to the left, the regions 334 and 335 are biased to ground potential via the bit lines BL-1 to BL-4 to avoid disturbance of memory cells in those strings. Thus, when the second stage of the program interval starts, hot carrier injection happens in the target memory cell 320, while the other memory cells in the array are not disturbed.

Figure 10:
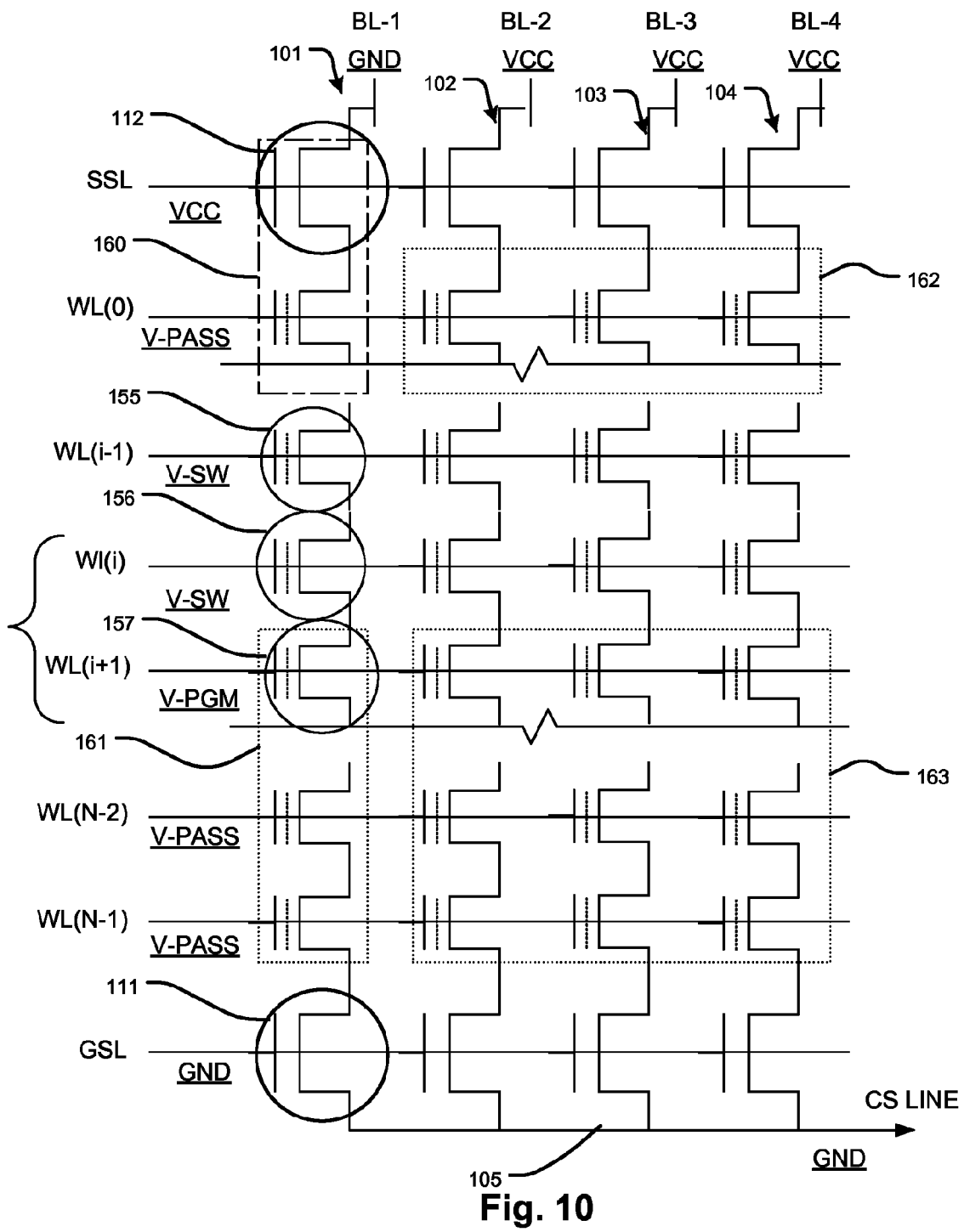
FIG. 10 is a schematic diagram of a common source type NAND-type memory array employing a program bias operation as described herein according to an alternative configuration including more than one switching cell.

FIG. 10 shows the bias conditions for a NAND array like that of FIGS. 6 and 7, in which two switching memory cells 155, 156 are adjacent to target memory cell 157 on the common source CS side of the string. FIG. 10 is a circuit diagram showing layout of four NAND strings 101, 102, 103, 104 which are coupled to respective bit lines BL-1 to BL-4 and to a common source CS line 105 by string select transistors and ground select transistors respectively. The bias voltages are shown for programming a target memory cell 157 on corresponding word line WL(i+1) in the NAND string 101. The first switch transistor 111 is biased by ground on the GSL line to decouple the NAND string from the grounded CS line 105.

The second switch transistor 112 is biased by VCC on the SSL line to couple the NAND string to the selected bit line BL-1, which is biased to ground. A switching memory cell 155 on corresponding word line WL(i−1) and a switching memory cell 156 on corresponding word line WL(i) are adjacent the target memory cell 157. Thus, the word lines WL(i−1) and WL(i) receive respective V-SW signals in support of the two stage program interval, which can be the same or somewhat different as suits a particular implementation. During the first stage of the program interval, the semiconductor body in region 160 is biased to the virtual source voltage Vs about zero volts. The semiconductor body in the region 161 is biased by capacitive coupling to the virtual drain voltage Vd. On the unselected bit lines which are biased to VCC, thereby decoupling the corresponding NAND strings from the bit lines, the regions 162, 163 are biased by capacitive coupling also to a relatively high voltage. Thus, when the second stage of the program interval starts, hot carrier injection happens in the target memory cell 157, while the other memory cells in the array are not disturbed. The use of two switching memory cells 155, 156 to isolate the virtual drain region 161 and the virtual source region 160 during the first stage of the program interval can suppress leakage current, including sub-threshold leakage, during the set up stage of the program interval.

Figure 11:
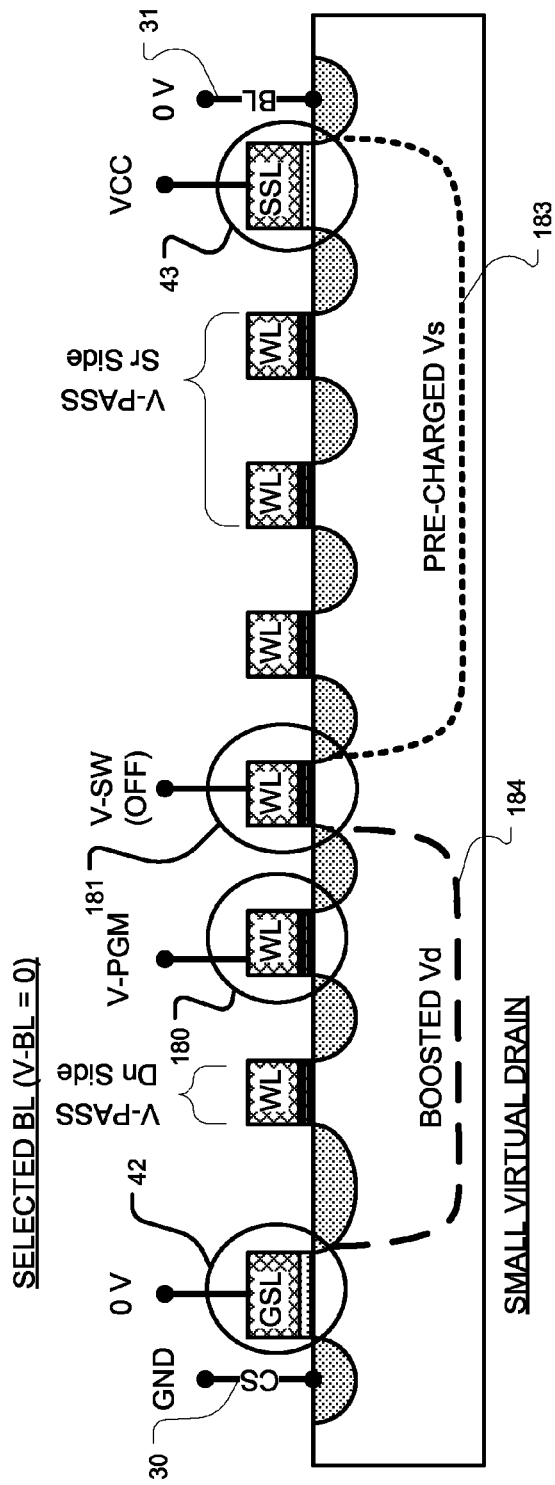
FIG. 11 is a simplified cross-sectional view of a selected NAND string showing a first stage of a program interval for boosted node hot carrier injection, where the target cell is close to one end of the NAND string.

FIG. 11 is a cross-section of a NAND string like that of FIGS. 2A and 2B. FIG. 11 shows biasing for the first stage in the condition that the target memory cell 180 is close to one end of the string, such as close to the ground select line GSL. In this condition, during the first stage of the program interval the common source CS line 30 is grounded, and the selected bit line 31 is also coupled to about zero volts. The GSL line 21 is coupled to about zero volts turning off the first switch 42, decoupling the semiconductor body from the CS line 30. The SSL line 28 is coupled to about VCC, turning on the second switch 43, and coupling the semiconductor body to the selected bit line 31. The word line corresponding to the target memory cell 180 receives a program pulse at V-PGM. The word line adjacent the target memory cell 180 on the side of the bit line receives a switching voltage V-SW establishing the switching memory cell 181. During the first stage of the program interval, V-SW is at a low-voltage so that the switching memory cell 181 serves to isolate the region of 183 and 184 in the semiconductor body. Under the biasing condition during a program setup interval, the region 184 in the semiconductor body 10 is boosted to a virtual drain voltage Vd by capacitive coupling in response to the pass voltage V-PASS (drain side) on the word line for the cell between the target word line which receives V-PGM and the GSL line. The region 183 in the semiconductor body 10 is pre-charged to a virtual source voltage Vs by coupling of the bit line 31 to the substrate. The voltage V-PASS (source side) is coupled to the word lines between the switching word line at cell 181 and the second switch 43. The boosted voltage level in region 184 and the reference voltage level in the region 183 are isolated by the depleted region beneath the switching memory cell 181. However, in this condition, the virtual drain region 184 is small, and the therefore will have a relatively small capacitance. Small capacitance will cause the amount of hot carrier generation during the region 90 of FIG. 3 to be smaller, and reduce the amount of hot carrier injection that could be achieved in a single program interval.

Figure 12:
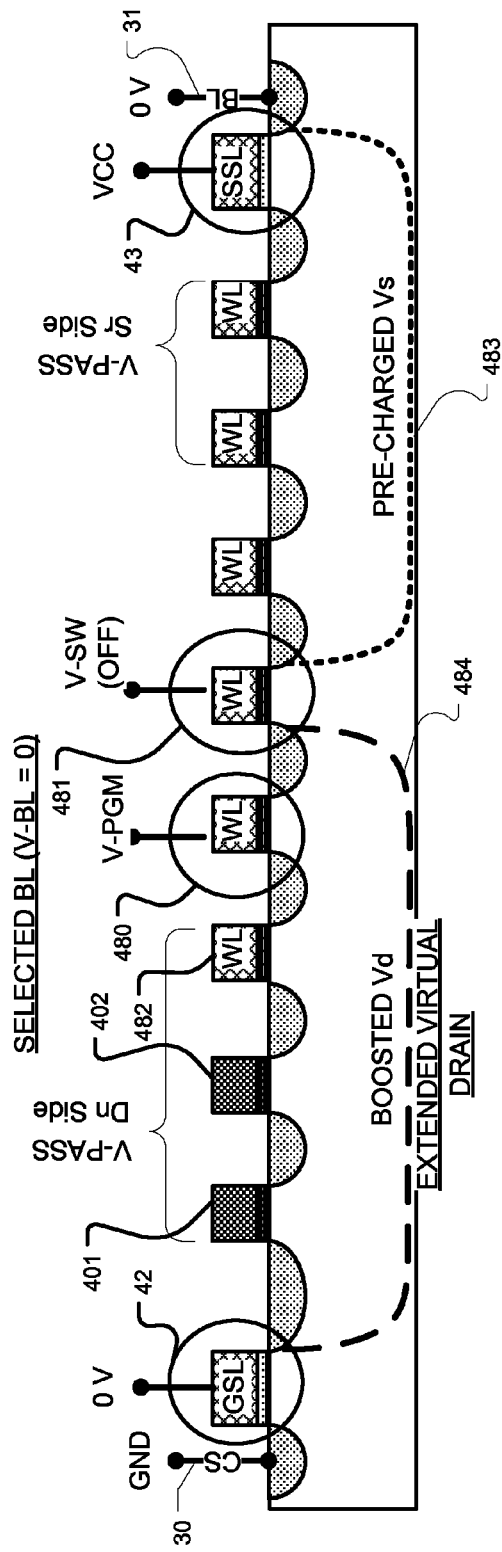
FIG. 12 is a simplified cross-sectional views of a selected NAND string showing a first stage of a program interval for boosted node hot carrier injection, where the NAND string is extended by dummy word lines.

Thus, as shown in FIG. 12, an alternative embodiment utilizes one or more dummy word lines (401, 402) between the GSL and the plurality of memory cells in the NAND string to improve the minimum programming efficiency. FIG. 12 is a cross-section of a NAND string like that of FIG. 11. FIG. 12 shows biasing for the first stage in the condition that the target memory cell 480 is close to one end of the string, such as close to the ground select line GSL. In this condition, during the first stage of the program interval the common source CS line 30 is grounded, and the selected bit line 31 is also coupled to about zero volts. The GSL line is coupled to about zero volts turning off the first switch 42, decoupling the semiconductor body from the CS line 30. The SSL line is coupled to about VCC, turning on the second switch 43, and coupling the semiconductor body to the selected bit line 31. The word line corresponding to the target memory cell 480 receives a program pulse at V-PGM. The word line adjacent the target memory cell 480 on the side of the bit line receives a switching voltage V-SW establishing the memory cell 481 as the switching memory cell. During the first stage of the program interval V-SW is at a low-voltage so that the switching memory cell 481 serves to isolate the regions 483 and 484 in the semiconductor body. Under the biasing condition during the first stage program interval, the region 484 in the semiconductor body 10 is boosted to a virtual drain voltage Vd by capacitive coupling in response to the pass voltage V-PASS (drain side) on the word line 482, and on the dummy word lines 401 and 402, between the target word line which receives V-PGM and the GSL line. The region 483 in the semiconductor body 10 is pre-charged to a virtual source voltage Vs by coupling of the bit line 31 to the substrate. The voltage V-PASS (source side) is coupled to the word lines between the switching word line at cell 481 and the second switch 43. V-PASS (source side) may be the same voltage as V-PASS (drain side), or may be different as suits a particular implementation or programming condition. The boosted voltage level in region 484 and the reference voltage level in the region 483 are isolated by the depleted region beneath the switching memory cell 181. As shown, in this condition, the virtual drain region 484 is guaranteed to include at least two cells under the dummy word lines 401 in 402, and the therefore will have a capacitance that enables a greater amount of hot carrier injection during the program interval. Note that the dummy cells can be used as the switching cells for programming the memory cell corresponding with word line 482 as a mode applying the CS line side as the virtual source.

Figure 13:
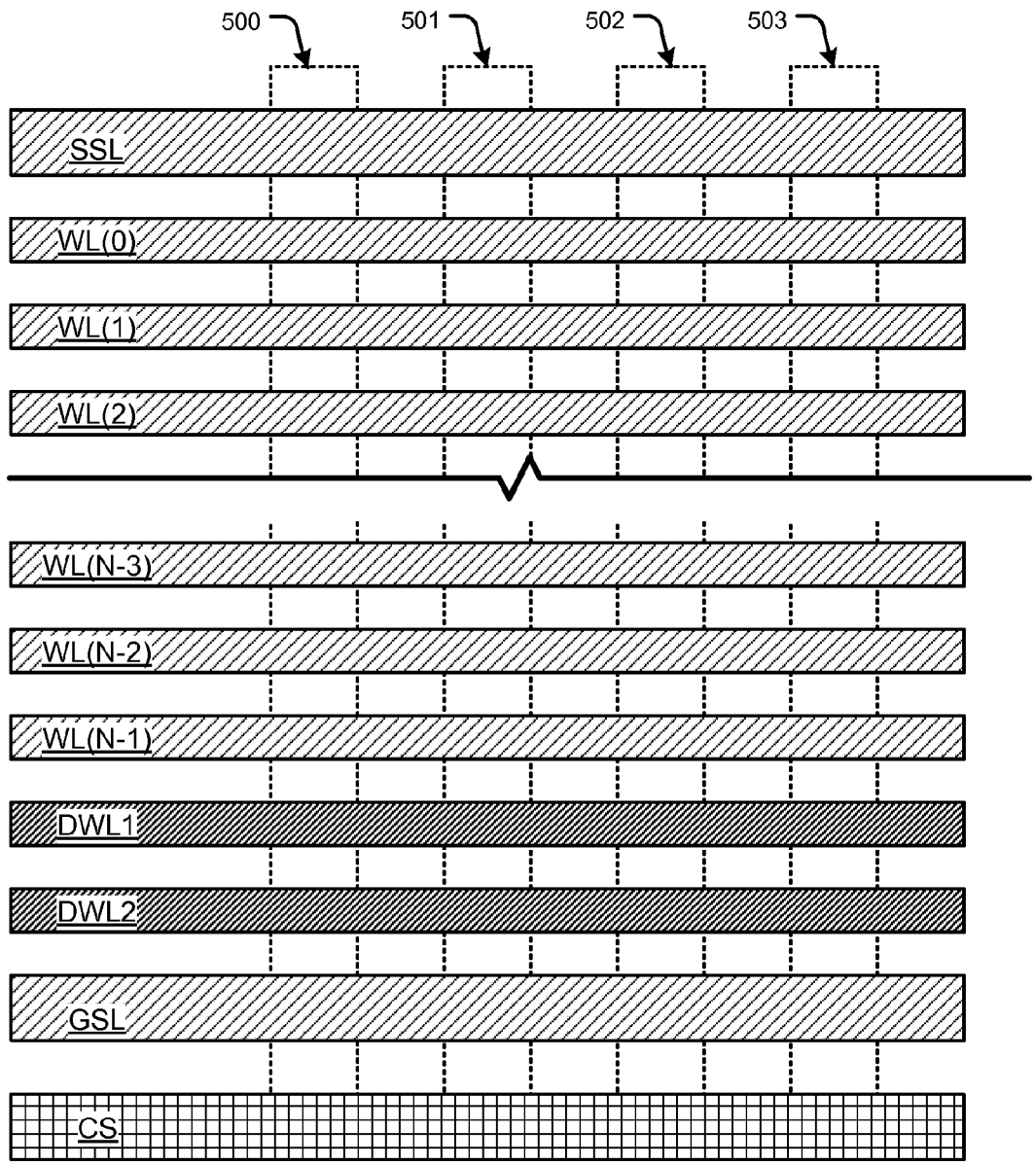
FIG. 13 is a simplified layout view of a NAND array showing a configuration for dummy word lines on the common source end of the strings.

FIG. 13 shows a simplified layout view showing the word lines and source-drain strings of a NAND array like that of FIG. 12 with dummy word lines DWL1 and DWL2 adjacent the GSL line. Thus, source-drain strings 500-503 extend vertically on the page. Horizontal conductor lines overlie the source-drain strings 500-503. The horizontal conductor lines include the SSL line, word lines WL0 to WL(N−1) and the dummy word lines DWL1 and DWL2. Also, the horizontal conductor lines include the GSL line and the common source CS conductor.

Figure 14:
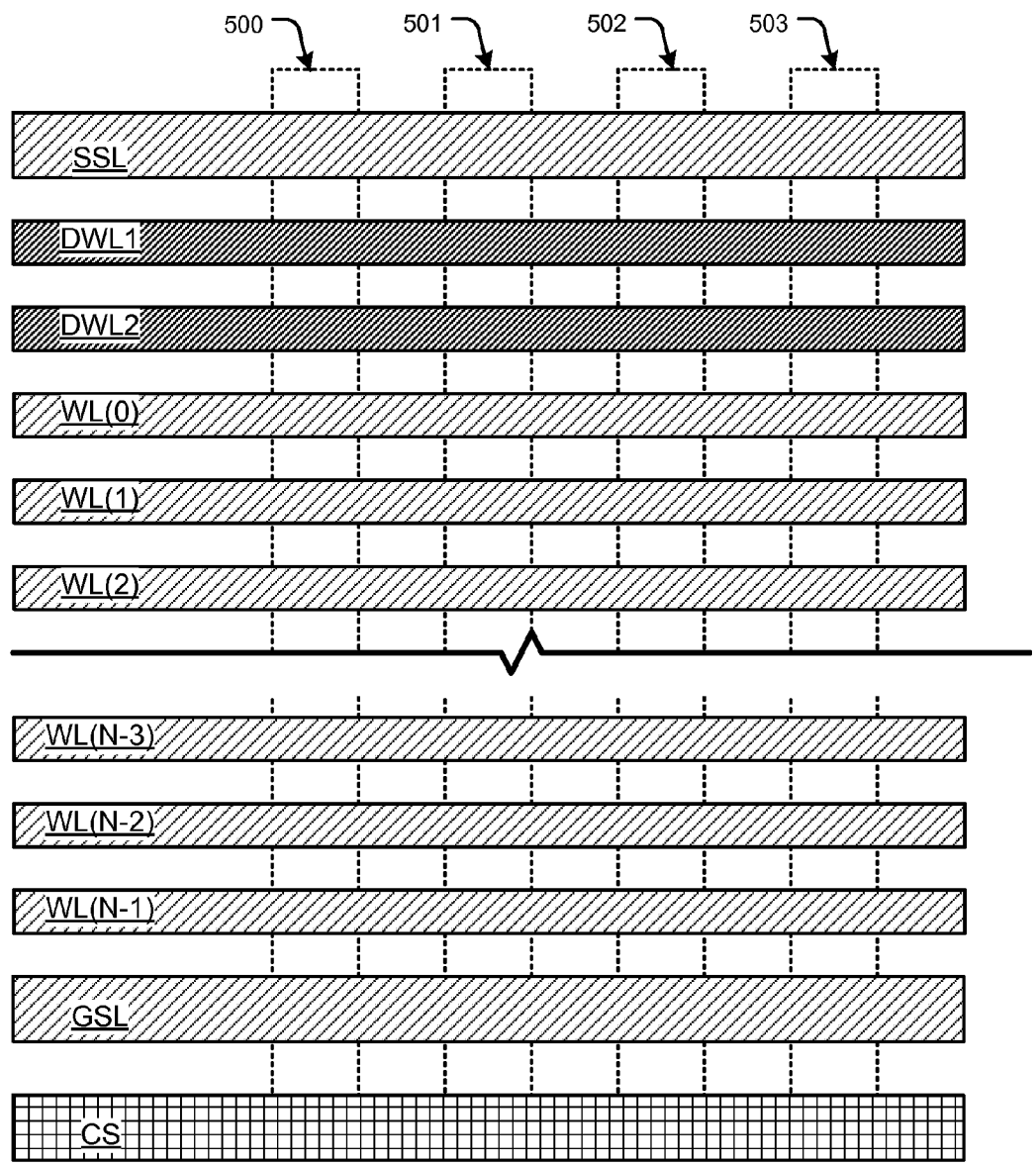
FIG. 14 is a simplified layout view of a NAND array showing a configuration for dummy word lines on the string select line end of the strings.

FIG. 14 shows a simplified layout view showing the word lines and source-drain strings of a NAND array like that of FIG. 12 with dummy word lines on the opposite end of the array, adjacent the SSL line. Thus, source-drain strings 500-503 extend vertically on the page. Horizontal conductor lines overlie the source-drain strings 500-503. The horizontal conductor lines include the SSL line, the dummy word lines DWL1 and DWL2, and the word lines WL0 to WL(n−1). Also, the horizontal conductor lines include the GSL line and the common source CS conductor.

Figure 15:
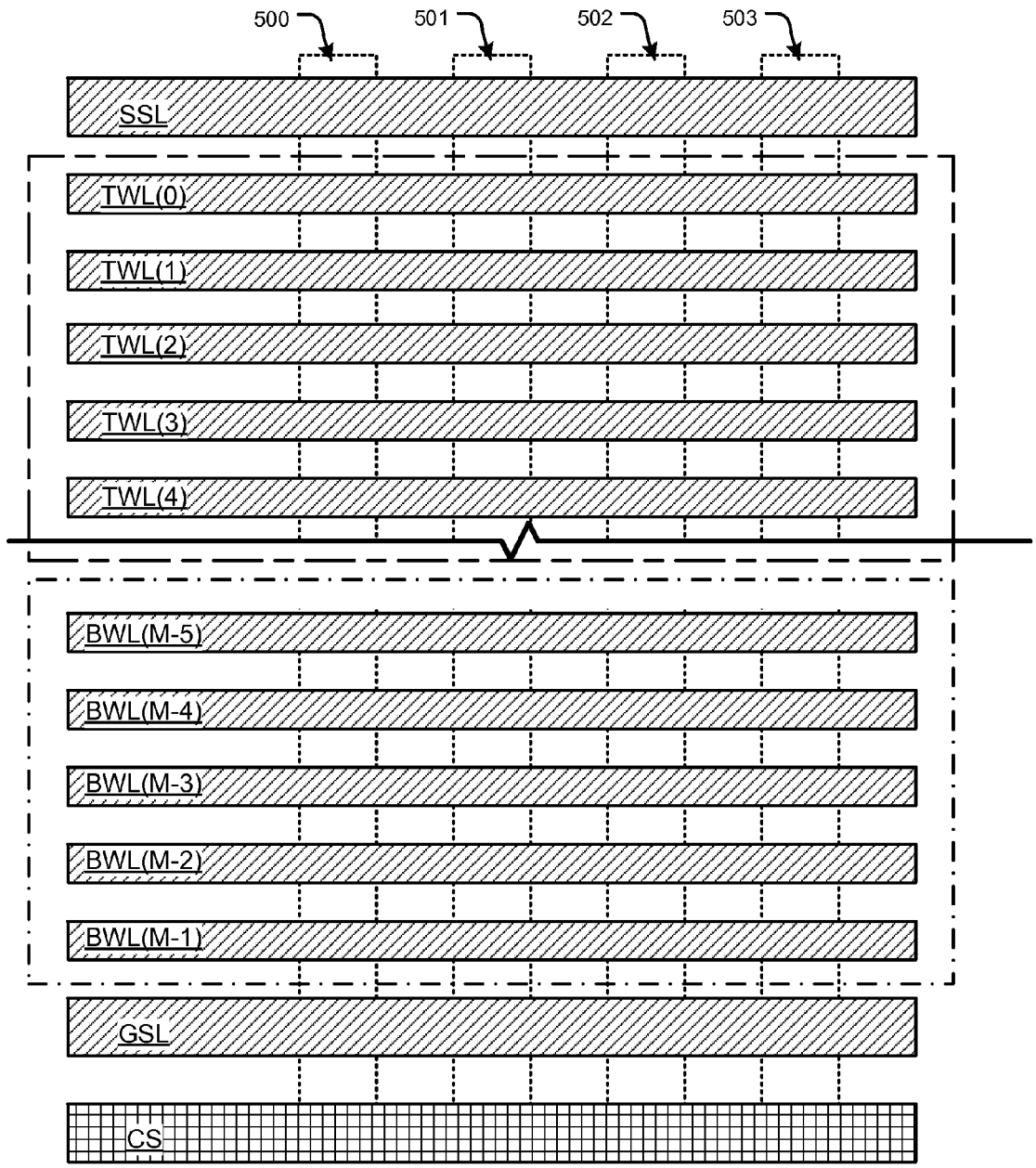
FIG. 15 is a simplified layout view of a NAND array showing a logical configuration word lines in the first and second sets operable so that the virtual drain side is always larger than the virtual source side of the selected memory cell.

FIG. 15 shows a simplified layout view showing the word lines and source-drain strings of a NAND array like that of FIG. 12 without dummy word lines. However, the word lines are logically arranged into a set of top word lines TWL(0) to TWL(N−1) (only TWL(0) to TWL(4) are shown) and a set of bottom word lines BWL(0) to BWL(M−1) (only BWL(M−5) to BWL(M−1) are shown). Thus, when a target cell falls within the top word lines, the programming operation is arranged so that the virtual drain region includes all the semiconductor body region beneath the bottom word lines. When the target cell falls within the bottom word lines, the programming operation is arranged so the virtual drain region includes all of the semiconductor body region beneath top word lines. In this manner, the programming performance for the hot carrier injection is improved.

Figure 16:
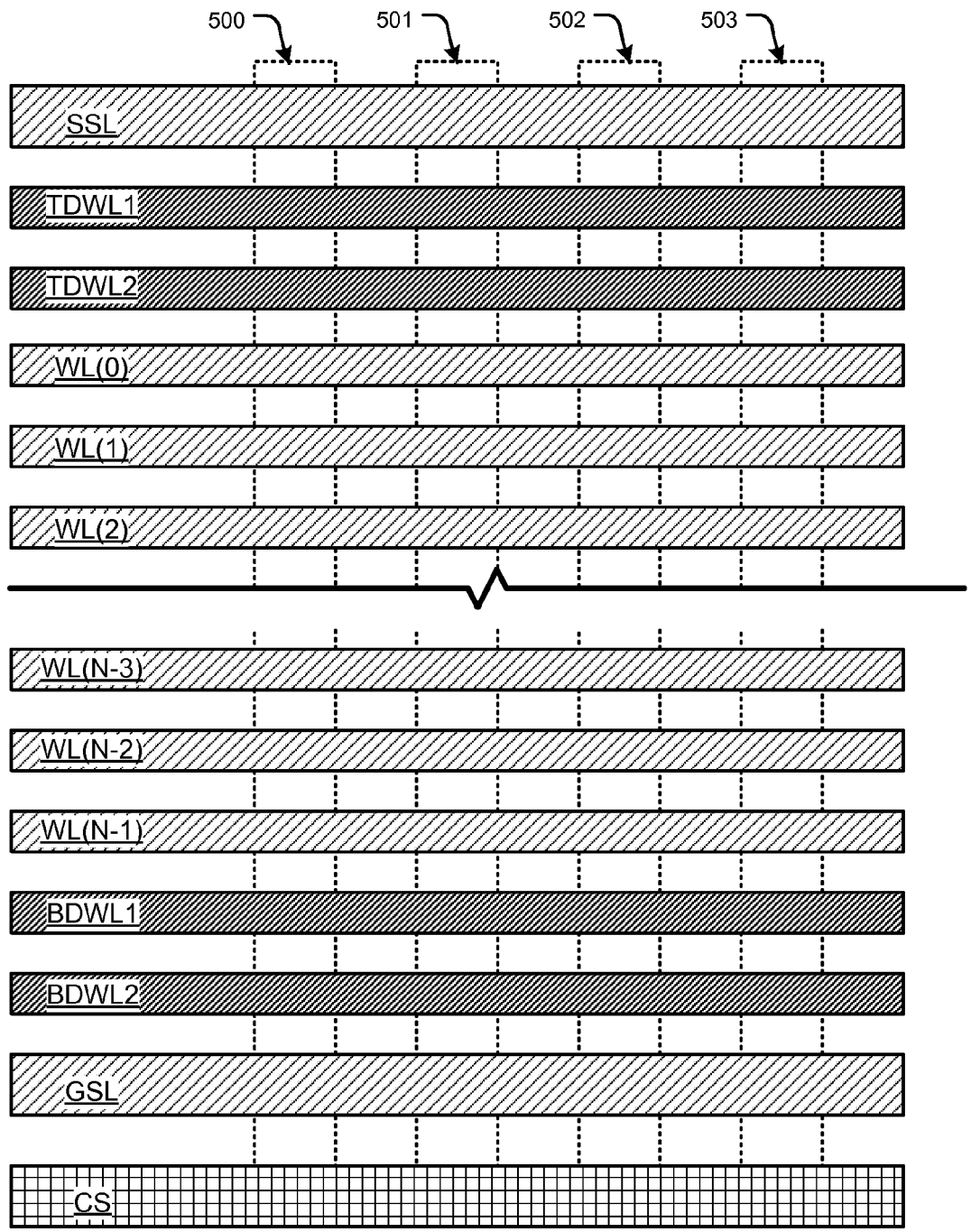
FIG. 16 is a simplified layout view of a NAND array showing a configuration for dummy word lines on both ends of the strings.

FIG. 16 shows a simplified layout view showing the word lines and source-drain strings of a NAND array like that of FIG. 12 with dummy word lines adjacent the GSL line and dummy word lines adjacent the SSL line. Thus, source-drain strings 500-503 extend vertically on the page. Horizontal conductor lines overlie the source-drain strings 500-503. The horizontal conductor lines include the SSL line, top dummy word lines TDWL1 and TDWL2, word lines WL0 to WL(N−1) and the bottom dummy word lines BDWL1 and BDWL2. Also, the horizontal conductor lines include the GSL line in the common source CS conductor.

Figure 17:
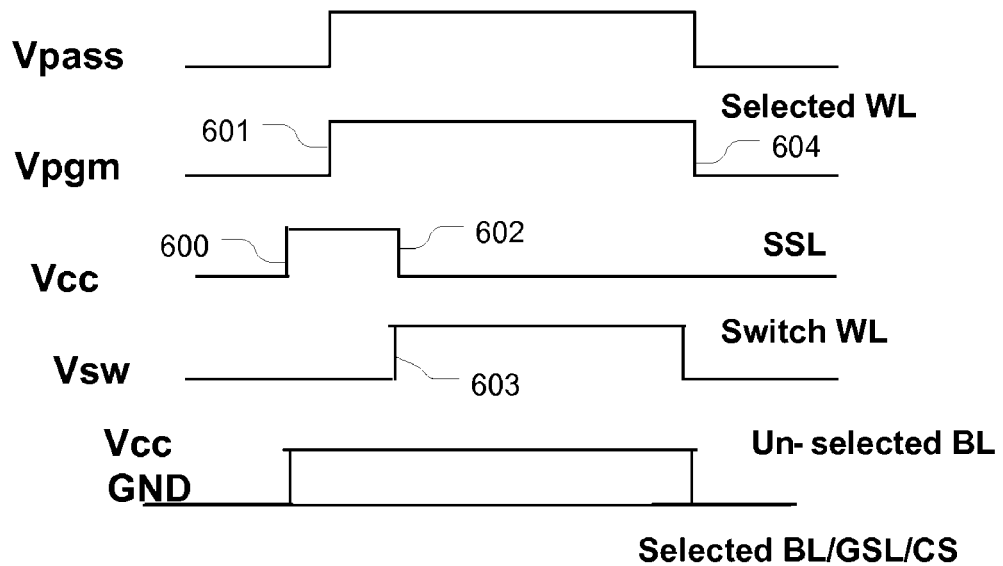
FIG. 17 is a timing diagram for an alternative operating mode for inducing boosted node hot carrier injection as described herein.
Figure 18:
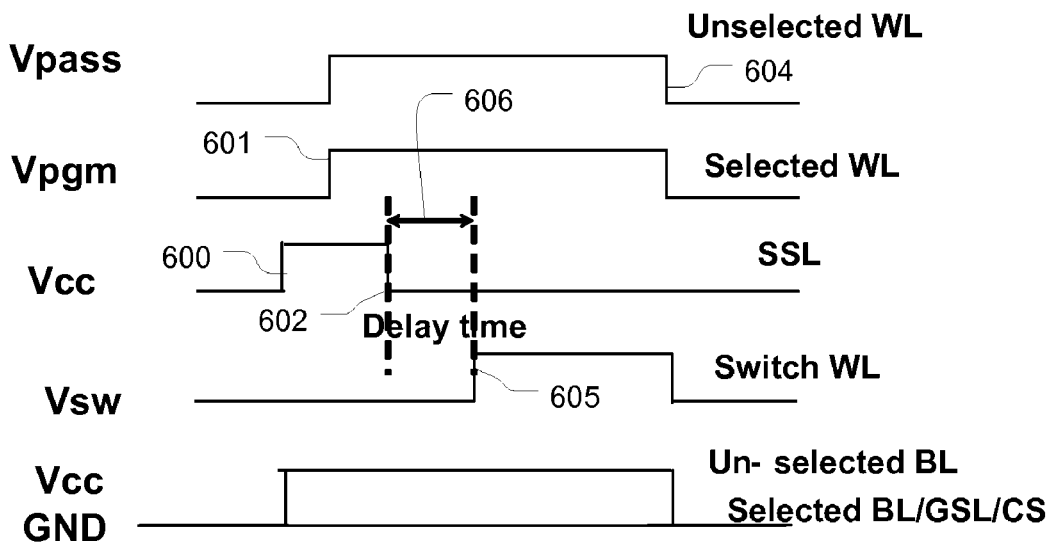
FIG. 18 is a timing diagram for another alternative operating mode for inducing boosted node hot carrier injection as described herein.

FIGS. 17 and 18 illustrate alternative timing arrangements for the program interval used to induce boosted-node hot carrier injection as described herein. These sequences include turning on the second switch by a high level on SSL during at least a part of the first stage of the program interval when switching voltage V-SW is low, and turning off the second switch by transitioning to a low level on SSL during at least a part of the second stage of the program interval in which the switching voltage V-SW is high. As shown in FIG. 17, during a program interval, the selected bit line BL, the ground select line GSL and the common source line CS are kept at ground potential while the unselected bit line BL is biased to VCC. At the beginning of the program interval at time 600, the SSL is biased to VCC, coupling ground to the semiconductor body. A short time after SSL switches to VCC at time 601, the target word line receives the V-PGM potential, the adjacent word line for the switching cell receives V-SW which is low enough to turn off the switching cell, and the other word lines along the NAND string receive the V-PASS potential. This sets the virtual drain region and virtual source region voltages as shown in FIG. 2A. According to the process of FIG. 17, SSL switches back to ground potential at time 602, rather than continuing at VCC during the entire program interval as shown in FIG. 3. The voltage V-SW switches to the higher voltage level at time 603, which can coincide with time 602. The program interval is over at time 604 when the program potential returns to ground, along with the other signals.

As shown in FIG. 18, a delay interval 606 can be introduced between the time 602 that the SSL line goes to ground and the time 605 that V-SW goes high. As before, during a program interval, the selected bit line, the ground select line and the common source line are kept at ground potential while the unselected bit line is biased to VCC. At the beginning of the program interval at time 600, the SSL is biased to VCC, coupling ground to the semiconductor body. A short time after SSL switches to VCC at time 601, the target word line receives the V-PGM potential, and the other word lines along the NAND string receive the V-PASS potential. In this sequence, V-SW transitions to the high level at time 605, after a delay of 606 from the time that SSL goes low. The program interval is over at time 604 when the program potential returns to ground, along with the other signals. These processes that turn off both the GSL and SSL switches can operate at lower power.

Figure 19:
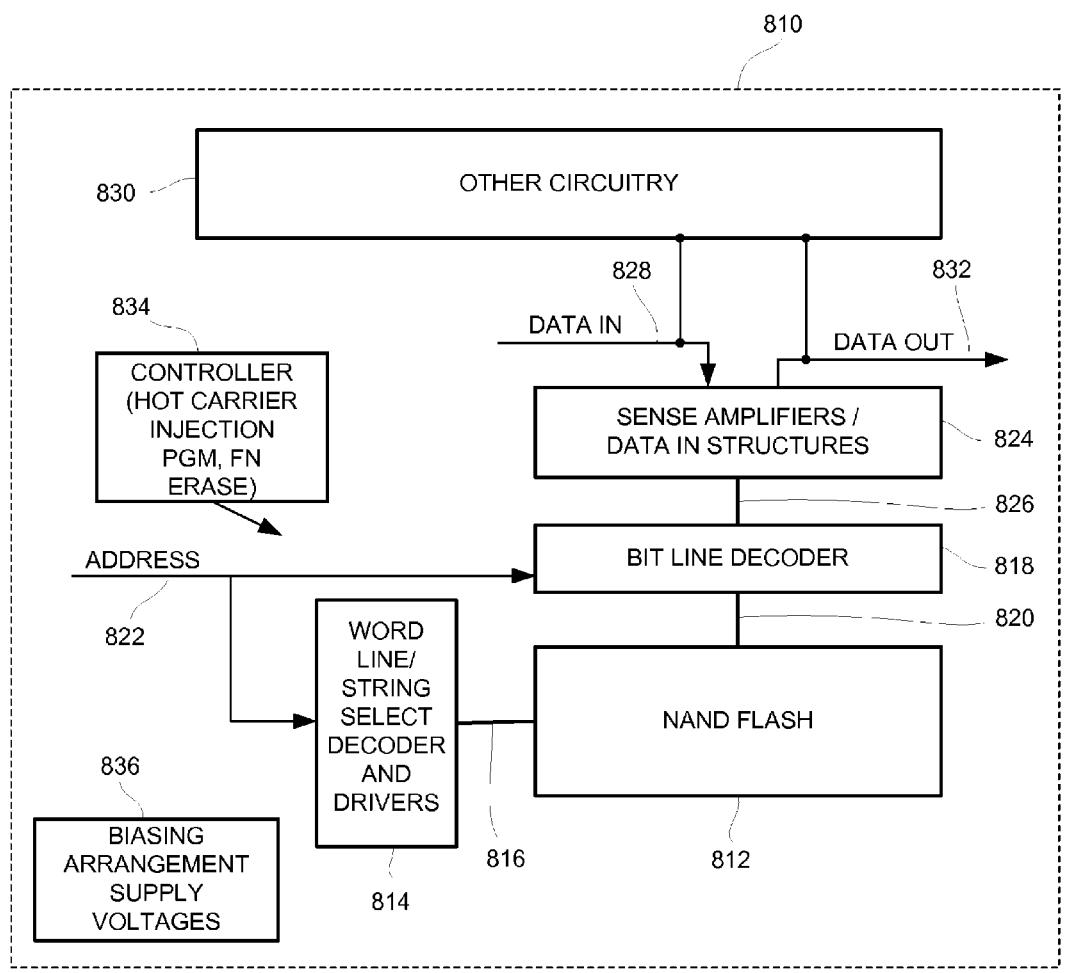
FIG. 19 is a block diagram of an integrated circuit memory employing memory cells and bias circuitry according to embodiments of the present invention.

FIG. 19 is a simplified block diagram of an integrated circuit employing boosted virtual drain, hot carrier injection programmed NAND flash as described herein. The integrated circuit 810 includes a memory array 812 implemented using charge trapping memory cells or floating gate memory cells, for example, on a semiconductor substrate. A word line (or row) and string select decoder 814 (including appropriate drivers) are coupled to, and in electrical communication with, a plurality 816 of word lines, string select lines and ground select lines, arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Addresses are supplied on bus 822 to the word line decoder and string select decoder 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

A controller 834 implemented in this example, using bias arrangement state machine, controls the application of bias arrangement supply voltages and current sources 836, such as read, program, erase, erase verify, program verify voltages or currents for the word lines and bit lines, and controls the word line/source line operation using an access control process. The controller implements the switching sequences used to induce boosted-node hot carrier programming as described herein. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834.

A new program method for NAND flash is provided which suppresses program disturb due to lower operation voltage. A new program based on use of boosted node potentials to achieve hot carrier injection enables use of reduced operation voltage. As a result of reduced operation voltages, the driving circuitry on the integrated circuit can be implemented using only one MOSFET process, without requiring additional high voltage MOSFET processes.

Compared to conventional channel hot electron injection operation, the BL voltage does not need to overcome the hot carrier injection barrier height. Thus, the BL voltage can be VCC or other voltages that are lower than requirements for conventional CHE programming voltage. Furthermore, the BL will not consume DC current during the hot carrier injection. So, the new program operation should achieve low power consumption.

Also, the WL voltage of this program method is lower than that required for conventional NAND flash FN programming operation. Thus very high voltage driving devices are not needed. Also, the vertical electric field across the tunnel oxide in the NAND flash array is smaller than that required for FN injection. As a result of lower E-field requirements, device reliability is better.

Furthermore, lower program and Vpass voltages than required for conventional FN operation cause reduced inter-WL dielectric voltages, and thus mitigate inter-WL dielectric breakdown issues that arise as the spacing between word lines shrinks.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   a plurality of memory cells arranged in series in a semiconductor body;
   a plurality of word lines, word lines in the plurality coupled to corresponding memory cells in the plurality of memory cells; and
   control circuitry coupled to the plurality of word lines adapted for programming a selected memory cell in the plurality of memory cells corresponding to a selected word line by:
   isolating a first semiconductor body region of the semiconductor body on a first side of the selected word line, and applying a pass voltage to word lines on the first side of the selected word line during a program interval, to boost the first semiconductor body region by capacitive coupling to a boosted voltage;
   applying a program voltage to the selected word line during the program interval;
   biasing a second semiconductor body region on a second side of the selected word line during the program interval, to a reference voltage level; and
   applying a switching voltage to a word line adjacent the selected word line, the switching voltage having a first stage and a second stage during the program interval, to isolate the memory cell corresponding to the selected word line from the reference voltage level during the first stage, and to couple the reference voltage level to the selected memory cell during the second stage.

2. The memory of claim 1, wherein the memory cell corresponding to the selected word line is biased during the second stage of the switching voltage for channel hot carrier programming.

3. The memory of claim 1, wherein the switching voltage during the second stage is less than the program voltage.

4. The memory of claim 1, wherein the plurality of memory cells is arranged as a NAND string.

5. The memory of claim 1, including a first switch between a bit line and a first end of the plurality of memory cells and a second switch between a reference line and a second end of the plurality of memory cells, and wherein the first semiconductor body region is between the second switch and the selected word line, and control circuitry turns on the first switch during the program interval, and turns off the second switch during the program interval.

6. The memory of claim 5, including a second plurality of memory cells coupled to the plurality of word lines, and wherein the control circuitry applies a voltage to a second bit line corresponding to the second plurality of memory cells to isolate a semiconductor body region in the second plurality of cells on the second side of the selected word line, and applies a pass voltage to word lines on the second side of the selected word line to boost the semiconductor body region in the second plurality of cells to a voltage level inhibiting hot carrier generation in a memory cell in the second plurality of memory cells coupled to the selected word line.

7. The memory of claim 5, including an additional cell in series with the plurality of memory cells in the semiconductor body region and an additional word line, and disposed between the plurality of memory cells and the second switch, and wherein the control circuitry applies a pass voltage to the additional word line during the program interval, whereby the capacitance of the semiconductor body region on the first side of the selected word line is increased.

8. The memory of claim 5, wherein the control circuitry turns on the second switch during at least a part of the first stage of the switching voltage, and turns off the second switch during at least a part of the second stage of the switching voltage.

9. The memory of claim 1, including a first switch between a bit line and a first end of the plurality of memory cells and a second switch between a reference line and a second end of the plurality of memory cells, and wherein the first semiconductor body region is between the first switch and the selected word line, and control circuitry turns off the first switch during the program interval, and turns on the second switch during the program interval.

10. The memory of claim 9, including a second plurality of memory cells coupled to the plurality of word lines and to a second bit line, and wherein the control circuitry operates during the program interval to bias the second bit line so that a first semiconductor body region for the second plurality of cells on a first side of the selected word line and a second semiconductor body region for the second plurality of cells on a second side of the selected word line are biased at a reference voltage level to inhibit hot carrier generation.

11. The memory of claim 9, including an additional cell in series with the plurality of memory cells in the semiconductor body region and an additional word line, and disposed between the plurality of memory cells and the first switch, and wherein the control circuitry applies a pass voltage to the additional word line during the program interval, whereby the capacitance of the semiconductor body region on the first side of the selected word line is increased.

12. The memory of claim 1, wherein the control circuitry applies a switching voltage to more than one word line during the program interval.

13. The memory of claim 1, wherein the plurality of word lines includes a first set of word lines near one end of the plurality of memory cells, and a second set of word lines near another end of the plurality of memory cells, and the control circuitry determines the one of the first or second sets of which the selected word line is a member, and assigns the first side of the selected word line as that side including the other of the first and second sets.

14. The memory of claim 1, wherein the plurality of memory cells are arranged in series in the semiconductor body between first and second switch transistors; and the plurality of word lines includes a first string select line and a second string select line coupled to the first and second switch transistors respectively.

* * * * *